United States Patent [19]

Nishio et al.

[11] Patent Number: 5,377,136
[45] Date of Patent: Dec. 27, 1994

[54] SEMICONDUCTOR INTEGRATED CIRCUIT DEVICE WITH BUILT-IN MEMORY CIRCUIT GROUP

[75] Inventors: Yoji Nishio; Fumio Murabayashi, both of Hitachi; Shoichi Kotoku, Katsuta; Akira Uragami; Manabu Shibata, both of Takasaki; Yoshitatsu Kojima, Matsuda; Fumiaki Matsuzaki, Takasaki, all of Japan

[73] Assignees: Hitachi, Ltd.; Hitachi Microcomputer Engineering, Ltd., both of Tokyo, Japan

[21] Appl. No.: 76,874

[22] Filed: Jun. 15, 1993

Related U.S. Application Data

[63] Continuation of Ser. No. 793,315, Nov. 15, 1991, which is a continuation of Ser. No. 446,855, Dec. 6, 1989, abandoned, which is a continuation of Ser. No. 112,946, Oct. 27, 1987, abandoned.

[30] Foreign Application Priority Data

Oct. 31, 1986 [JP] Japan .................................. 61-258286
Mar. 27, 1987 [JP] Japan .................................. 62-71514

[51] Int. Cl.⁵ .............................................. G11C 5/06
[52] U.S. Cl. ......................................... 365/63; 366/51; 366/230.05
[58] Field of Search ...................... 365/63, 51, 230.05, 365/189.01, 230.03

[56] References Cited

U.S. PATENT DOCUMENTS 4,791,607 12/1988 Igarashi .................................. 365/51
4,945,513 7/1990 Ueda ...................................... 365/63
5,146,428 9/1992 Tanimura ............................... 365/63

Primary Examiner—Eugene R. LaRoche
Assistant Examiner—A. Zarabian
Attorney, Agent, or Firm—Antonelli, Terry, Stout & Kraus

[57] ABSTRACT

A semiconductor integrated circuit device with a built-in memory circuit group is disclosed, wherein wiring is started from a data terminal position near a data exchange portion of a memory circuit group to reduce the length of a wiring. Accordingly, an operation speed can be improved by the reduction of wiring capacitance and a ratio of unwired wirings can be reduced by reduction of an occupying ratio of wiring channels.

7 Claims, 23 Drawing Sheets

131

130

|  | ADDRESS1 | ADDRESS2 | ADDRESS3 |
|---|---|---|---|
| DATA 1 | "0" | "1" | "1" |
| DATA 2 | "1" | "0" | "1" |

SEMICONDUCTOR INTEGRATED CIRCUIT DEVICE WITH BUILT-IN MEMORY CIRCUIT GROUP

This is a continuation of application Ser. No. 793,315, filed Nov. 15, 1991; which is a continuation of Ser. No. 446,855 filed on Dec. 6, 1989, which is a continuation of Ser. No. 112,946 filed on Oct. 27, 1987, now abandoned.

BACKGROUND OF THE INVENTION

This invention relates generally to a semiconductor integrated circuit device, and more particularly to a master chip system which will be suitable for a gate array LSI with a built-in memory circuit group.

"PROCEEDING OF IEEE INTERNATIONAL CONFERENCE ON COMPUTER DESIGN", 1984, pp 424–427 is known as the reference on the gate array with a built-in 3-port RAM having a changeable structure. However, this prior art reference does not deal with the problem of the wiring method of RAM data in the gate array and does not mention, either, the problems resulting from the changeable RAM structure and its changing method.

In other words, since the prior art technique described above does not take wiring of RAM data into consideration, it is not free from the problems of the drop of the RAM speed and the trouble of wiring depending on the place of use of the RAM data.

SUMMARY OF THE INVENTION

The present invention contemplates to improve freedom of the terminal positions of read/write data of a built-in memory circuit group, to attain a higher operation speed of the built-in memory circuit group and to minimize any adverse influences on a basic gate circuit portion.

It is another object of the present invention to provide a memory to be incorporated in a gate array which memory has a high packaging density and high versatility.

The first object described above can be accomplished by improving the freedom of the terminal positions of the data of the built-in memory circuit group and by starting wiring from the terminal position near a data exchange portion.

The second object of the invention described above can be accomplished by employing a method, as a changing method of bit×word, which includes X decoders and Y decoders, changes only the Y decoder system and uses the wiring positions of Y decoder output lines also as the wiring positions of data lines thereby to have the number of ports be variable.

Since wiring is started from the data terminal position near the data exchange portion of the memory circuit group, the wiring can be shortened, a higher operation speed can be attained by the reduction of the wiring capacitance and the ratio of unwired wirings can be reduced by the reduction of an occupying ratio of wiring channels.

Since the wiring positions of the Y decoder output lines are used also as the wiring positions of the data lines, the maximum number of lines of the number of words plus the number of bits, which are to be borne by the Y decoders among the word×bit variable structure under consideration, may be prepared as the number of lines for both kinds of lines described above, so that the packaging efficiency can be improved.

These and other objects and novel features of the present invention will become more apparent from the following description of the embodiments of the invention to be taken in conjunction with the accompanying drawings.

DESCRIPTION OF THE PREFERRED EMBODIMENTS

Figure 1:
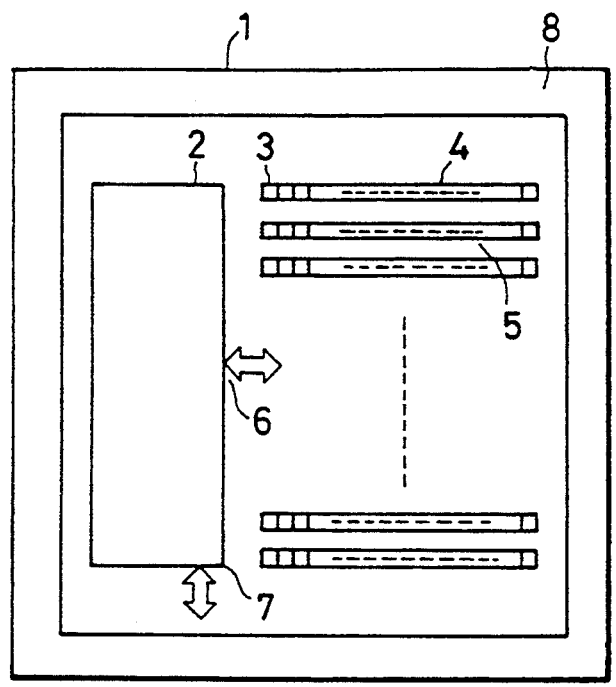
FIG. 1 is an explanatory view showing the chip of a gate array with built-in RAM in accordance with one embodiment of the present invention.

Hereinafter, one embodiment of the present invention will be described with reference to FIG. 1. Basic cells 3 are aligned in a transverse direction inside a gate array LSI chip 1 to constitute a basic cell row 4, and a plurality of these basic cell rows are alternately aligned while interposing wiring channel regions 5. A memory 2 as a micro-functional circuit is disposed at the extreme end of the semiconductor chip. An input/output circuit region 8 is disposed around the chip 1. The data input/output operation of the memory 2 can be made on the side 6 of the memory 2 facing the basic cell row group and on its side 7 facing the input/output circuit region 8. Since at least two input/output data positions are secured in this manner, it becomes possible to attain a high access speed and to improve wiring efficiency.

Figure 2:
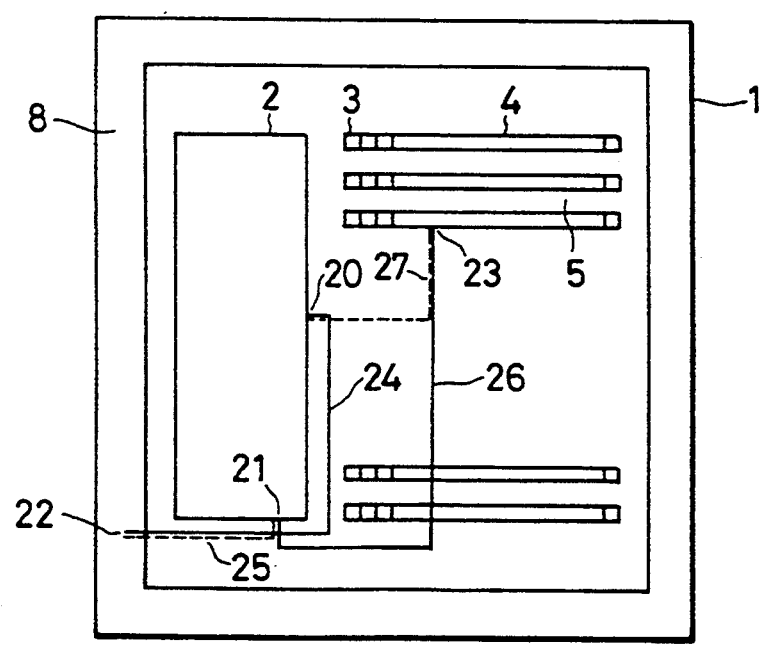
FIG. 2 is an explanatory view showing the effect of wiring of RAM data.

The embodiment will be explained in further detail with reference to FIG. 2. If the memory 2 is equipped only with an input/output terminal 20, signal transmission to and from an input/output circuit 22 is made through a wiring 24. Therefore, if an input/output terminal 21 having the same function is provided, a wiring 25 represented by dash line will suffice this object. On the other hand, if only an intput/output terminal 21 is disposed, a wiring 26 is formed for the purpose of signal transmission to and from the basic cell 23. A wiring 27 represented by dash line will suffice this object if an input/output terminal 20 having the same function is disposed. As can be understood from the comparison of the wirings 24 with 25 or the wirings 26 with 27, the wiring length can be reduced to 50% or below by disposing two input/output terminals. In other words, the wiring load capacity can be reduced to 50% or below and the high access speed can be accomplished. Since the use ratio of the wiring channel can be reduced, too, the ratio of unwiring by automatic wiring by a computer can be reduced and the increase of the development period, which is one of the characterizing features of the gate array LSI, by the incorporation of memories can be prevented. Besides the effect described above, this embodiment does not require the increase of the wiring region due to incorporation of the memories so that the chip size can be reduced.

Figure 3:
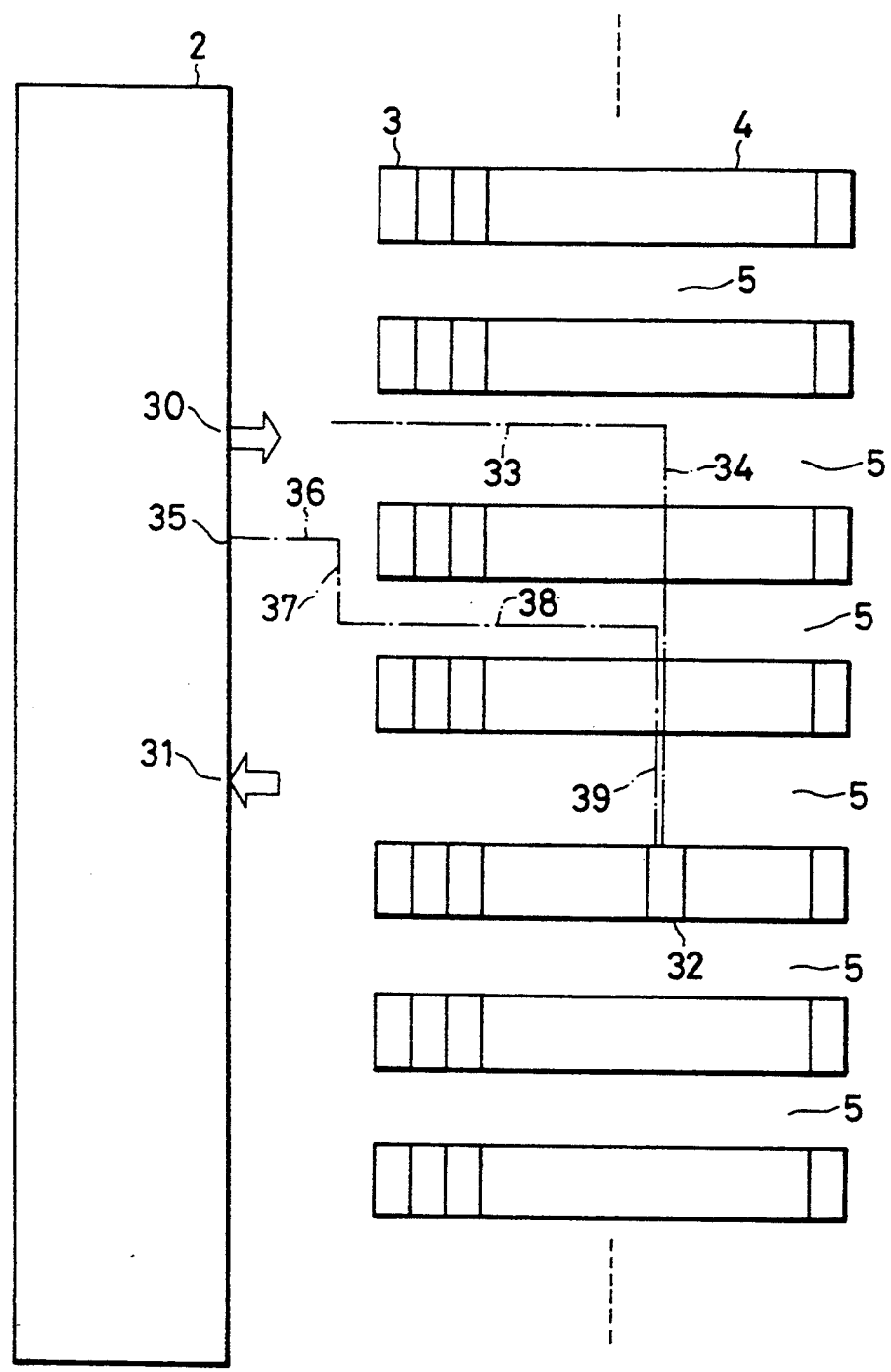
FIG. 3 is a view showing the disposition of the basic cell rows in one embodiment of the present invention.

Next, FIG. 3 shows the relationship between the input/output terminal of the memory 2 and the basic cell row 4. The input/output terminals 30, 31 of the memory cell 2 facing the basic cell row group face wiring channel regions 5 between the basic cell rows. They are put on the grid of DA (data automation). In this manner, wiring can be made efficiently by a first layer Al wiring extending in an X direction (hereinafter called "AL1") and a second layer Al wiring extending in a Y direction (hereinafter called "AL2"). Such an example is shown in FIG. 3. The output of the memory 2 is inputted to the basic cell 32 through the AL1 wiring 33 and the AL2 wiring 34. Unless the input/output terminal of the memory 2 faces the wiring channel region 5, the signal of the output terminal 35 of the memory must be wired to the wiring channel region through the AL1 wiring 36 and the AL2 wiring 37. Namely, the wiring channel corresponding to the AL2 wiring 37 is necessary and the memory 2 and the basic cell row 4 must be spaced apart from each other by the space corresponding to the AL2 wiring(s). In other words, the chip area will increase unless the input/output terminals of the memory face the wiring channel regions 5.

Another characterizing feature in FIG. 3 is that the number of channels of the wiring channel regions 5 which the input/output terminals 30, 31 of the memory 2 face is greater than the number of channels of the other wiring channel regions 5. Since the signal line for the signal transmission to and from the memory must be disposed in the wiring channel region facing the input/output terminal of the memory 2, the number of unwired wirings by automatic wiring DA can be minimized and the increase of the chip area can be prevented by increasing the number of channels at that portion.

Figure 4:
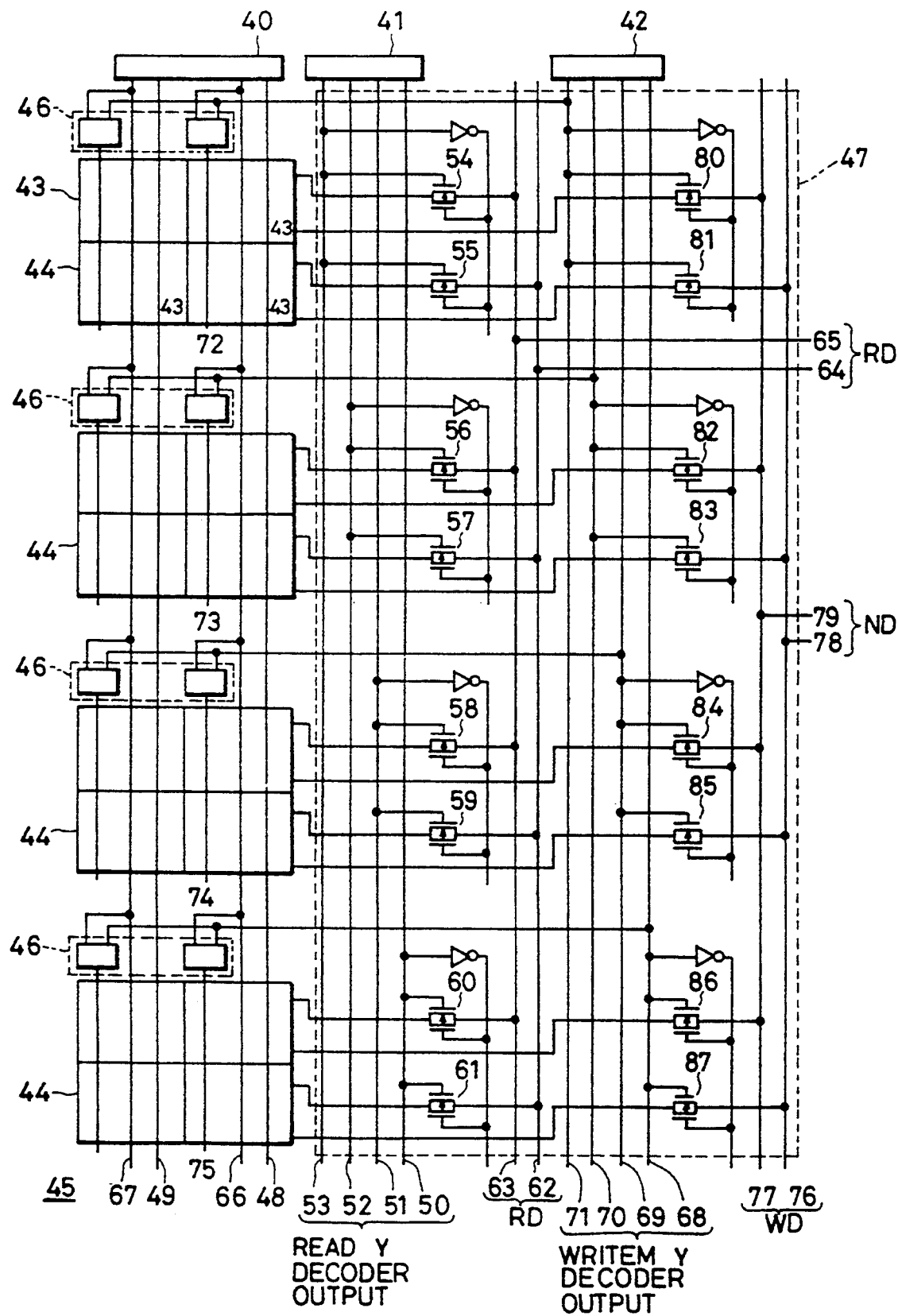
FIG. 4 shows the structure of RAM (2 ports, 8 w×2 b) in one embodiment of the present invention.
Figure 5:
FIG. 5 is an address map of FIG. 4.

FIG. 4 shows a structural example of the memory 2. This example represents static RAM of 8 words by 2 bits for the sake of simplification (hereinafter called "SRAM"), which is of 1-write/1-read 2-port type. However, the concept of the present invention can be expanded similarly irrespective of the number of total bits and the number of ports. This memory consists of four each read/write X decoders 40, read Y decoders 41 and write Y decoders 42, four each memory cells 43, 43, that is, four each memory cell blocks 4, 44 of 2-word×2-bit type, or in other words, an 8-word×2-bit memory cell array 45, a write control circuit 46 disposed above each memory cell block 44 and an input/output control circuit 47. The address map of this memory is shown in FIG. 5. Since the memory is of the 8-word type, the address consists of 3 bits. The lowermost bit is inputted to the X decoder the upper 2 bits are inputted to the Y decoder.

First of all, the read operation will be explained. When the read lowermost bit address is "0", the output signal 48 of the X decoder 40 becomes "1" and the right half of the memory cell array 45 is selected. When the lowermost bit address is "1", the output signal 49 of the X decoder 40 is "1" and the left half of the memory cell array 45 is selected. When the upper two bit address is "00", "01", "10" and "11", the output signals 50, 51, 52 and 53 of the read Y decoder 41 are "1", respectively. When, for example, the read address is "111", the signals 49 and 53 are "1", so that the left half of the memory cell array 45 is selected and among the read transfer gates 54 to 61, gates 54 and 55 are ON with the other being OFF. As a result, the data of the memory cell 43 corresponding to the read address "111" are read out on the read data signal lines 62, 63. Since the space corresponding to the write control circuit 46 disposed between the memory cell blocks 44 occurs in the input/output control circuit 47, the read data signal lines 64, 65 can be extended in the X direction, too.

Next, the write operation will be described. When the lowermost bit of the write address is "0", the output signal 66 of the X decoder 40 is "1". The output signal of the write control circuit 46, to which the signals, among the output signals 68 to 71 of the write Y decoder 42, which are "1", are inputted, becomes "1". When the upper two bit address of the write address is "00", "01", "10" and "11", the output signals 68, 69, 70, 71 of the Y decorder output 42 are "1", respectively. Therefore, when the write address is "110", the signal 72 among the output signals 72 to 75 of the write control circuit 46 is "1" and the write signal is applied to the memory cell 43 at the address "110".

When the lowermost bit of the write address is "1", the output signal 67 of the X decoder 40 is "1" and the operation is the same as above. Write transfer gates 80–87 are turned ON and OFF in accordance with the levels of the output signals 68–71 of the write Y decoder 42. For example, when the signal 71 is "1", the transfer gates 80 and 81 with the others being turned OFF and the write data of the signal lines 76, 77 are sent into the memory cell block 43 disposed at the uppermost position.

In the same way as the read data, the write data lines 78, 79 for the write data, too, can be extended also in the X direction. In other words, as shown in FIG. 1, it is possible to arrange the read/write data signal terminals on the side facing the input/output circuit region 8 and on the side facing the basic cell row group 4. In accordance with this embodiment, since the write data lines 78, 79 or the read data lines 64, 65 can be extended freely from the portions corresponding to the gaps between the memory cell blocks 44, the freedom of the terminal positions on the side facing the basic cell row group is extremely high and the effects of accomplishing a higher operation and reducing unnecessary wirings are great.

Figure 7:
FIG. 7 is an address map of FIG. 5.
Figure 6:
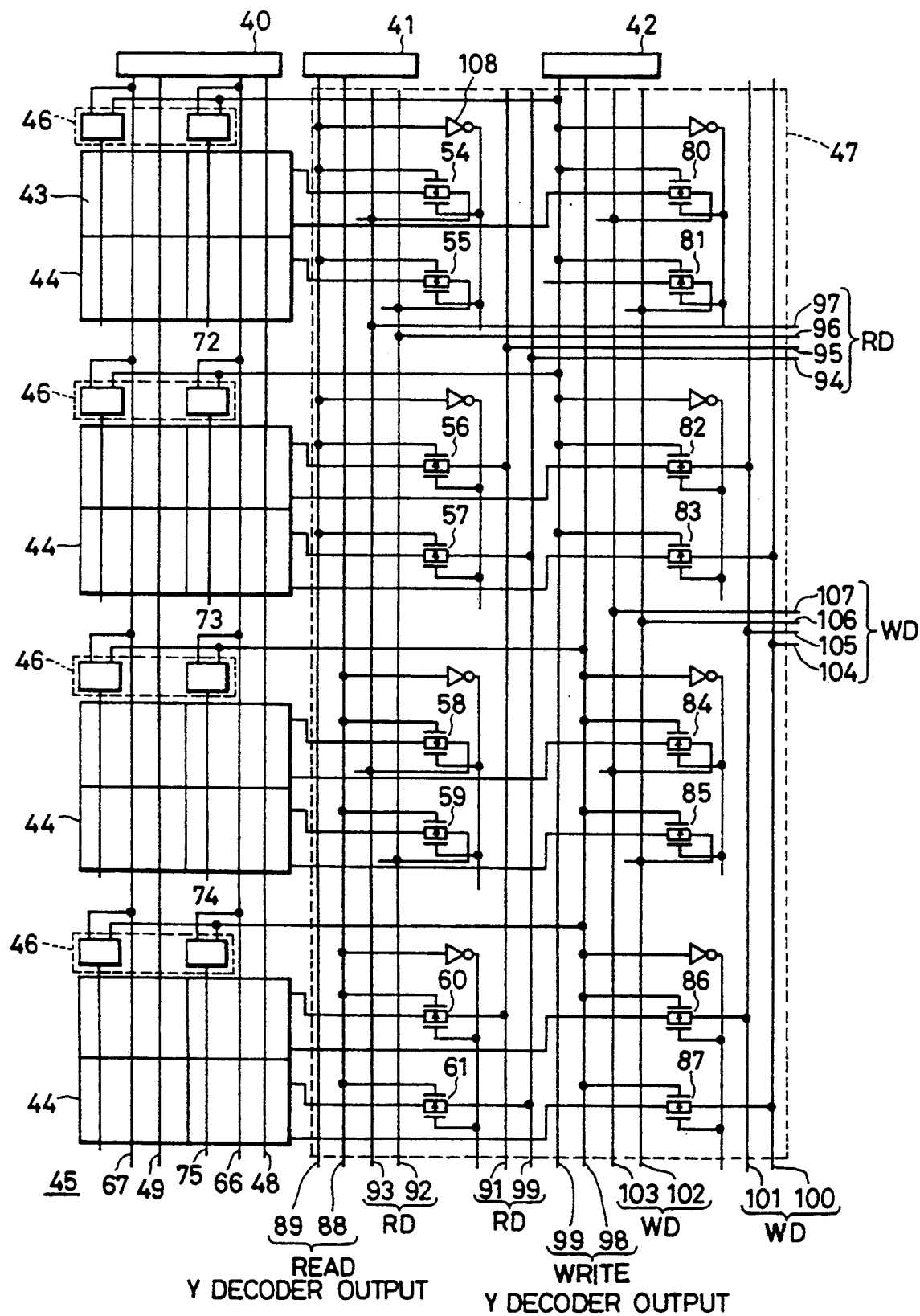
FIG. 6 is a view showing the structure of RAM (2 ports, 4 w×4 b) in one embodiment of the present invention.

FIG. 6 shows a 2-port SRAM structure of a 4-word by 4-bit type by changing only the wirings of the read Y decoder 41, the write U decoder 42 and the input/output control circuit 47 shown in FIG. 4. FIG. 7 shows the address map of this memory. Like reference numerals are used to identify like constituents in both FIGS. 6 and 4. Since this memory is of the 4-word type, the address has two bits for write and two bits for read. The lowermost bit is inputted to the X decoder 40 while the uppermost bits for read and write are inputted to the Y decoders 41 and 42, respectively. In the case of FIG. 4, however, the Y decoders 41 and 42 are the 2-bit decoders but they are the 1-bit decoders in FIG. 6. This change can be made by changing the custom mask as is employed in ordinary gate arrays.

First of all, the read operation will be explained. The X decoder system is the same as in FIG. 4 and its explanation will be omitted. When the uppermost bit address is "0", the output signal 88 of the read Y decoder 41 is "1" and when the uppermost bit address is "1", the output signal 89 of the Y decoder 41 becomes "1". For example, when the read address is "11", the output signal 49 of the X decoder 40 and the output signal 89 of the Y decoder 89 are "1". Therefore, the left half of the memory cell array 45 is selected and the read transfer gates 54, 55, 56 and 57 among the gates 54 to 61 are turned ON with the others being turned OFF. As a result, the data of the memory cell 43 corresponding to the read address "11" is read out to the read data lines 90, 91, 92 and 93. The read data signal lines 94, 95, 96 and 97 can be extended in the X direction, too, in the same way as in FIG. 4.

Next, the write operation will be explained. Since the X decoder system is the same as in FIG. 4, its explanation will be omitted. When the uppermost bit of the write address is "0", the output signal 98 of the write Y decoder 42 is "1" and when the uppermost bit is "1", the output signal 99 of the Y decoder 42 is "1". For example, when the write address is "10", the output signal 66 of the X decoder 40 is "1", and the output signal 99 of the Y decoder 42 is "1". Therefore, the write transfer gates 80, 81, 82, 83 are turned ON among the write transfer gates 80 to 87 with the others being turned OFF, and the output signals 72 and 73 of the write control circuit 46 are "1". Accordingly, the write data of the signal lines 100, 101, 102 and 103 are written into the memory cell 43 of the address "10". In the same way as the read data, the write data lines 104, 105, 106 and 107, too, can be extended also in the X direction. Therefore, in accordance with this RAM structure, the word×bit structure can be changed by merely changing the wiring steps of the Y decoder and the input/output control circuit. Even when the word×bit structure is changed, it is possible to arrange the read write data signal terminals on the side facing the input/output circuit region 8 and on the side facing the basic cell row group 4 as shown in FIG. 1.

Another characterizing feature lies in the wiring method of the Y decoder output signal and the read/write data signal passing through the input/output control circuit 47. The read Y decoder output lines 50 and 51 in FIG. 4 correspond to the read data signals 92, 93 in FIG. 6. The write Y decoder signal output lines 68, 69 in FIG. 4 correspond to the write data signal lines 102, 103 in FIG. 6. The wiring positions remain the same, though the kind of signals change. In this manner, the occupying area of the input/output control circuit 47 can be reduced by using the wiring positions in accordance with the change of the bit×word structure without securing the positions for only the decoder output or for only the read/write data. As can be seen from the embodiments shown in FIGS. 4 and 6, the area can be reduced by four wirings in comparison with the case where the exclusive positions are secured.

Figure 8:
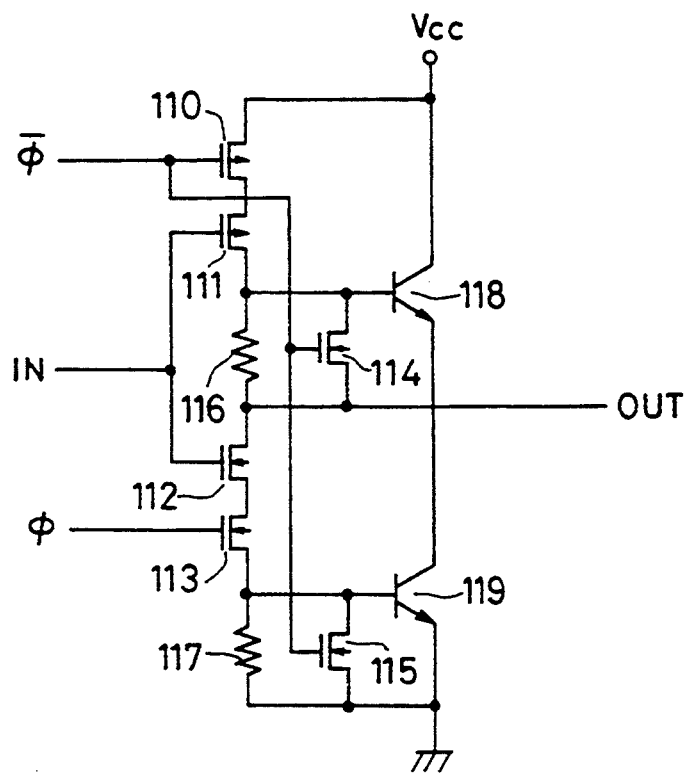
FIG. 8 is a tri-state circuit diagram of a bipolar CMOS composite.

Next, the wiring method described above will be explained with reference to one definite example. In FIG. 4 or 6, the transfer gates 54, etc. are used as the tristate circuit in the input/output control circuit 47, but it is possible to use a tristate circuit of bipolar CMOS composite such as shown in FIG. 8. For the detailed operation of this circuit, refer to Japanese Patent Laid-Open No. 175167. When a $\phi$ signal is "1", the circuit operates as a circuit corresponding to an inverter of bipolar CMOS composite shown in FIG. 9 (refer to FIG. 3 of Japanese Patent Laid-Open No. 11034) and when the $\phi$ signal is "0", the output becomes a high impedance output. Since the data line load can be driven at a high speed by use of this circuit, the data read and write speeds can be improved.

Figure 9:
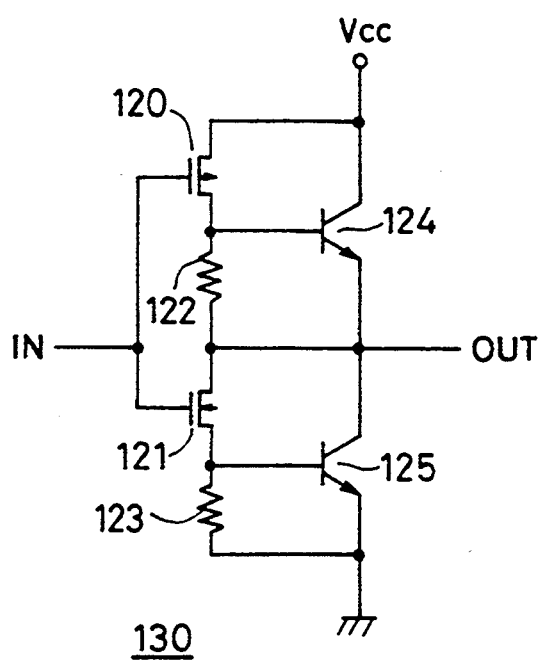
FIG. 9 is an inverter circuit diagram of a bipolar CMOS composite.
Figure 10:
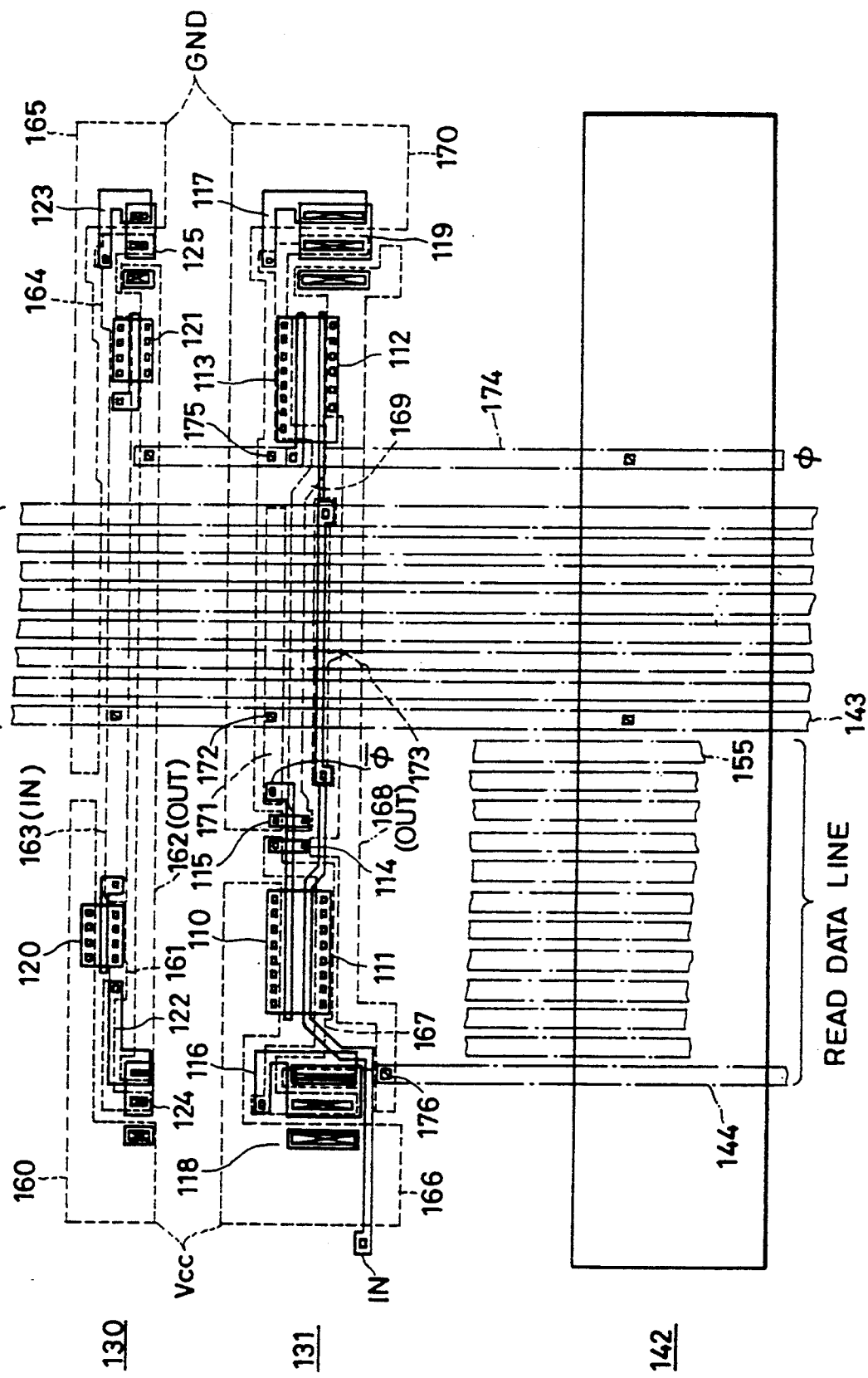
FIG. 10 is a layout pattern diagram (8 w×12 b) of the memory read portion of one embodiment of the invention.
Figure 11:
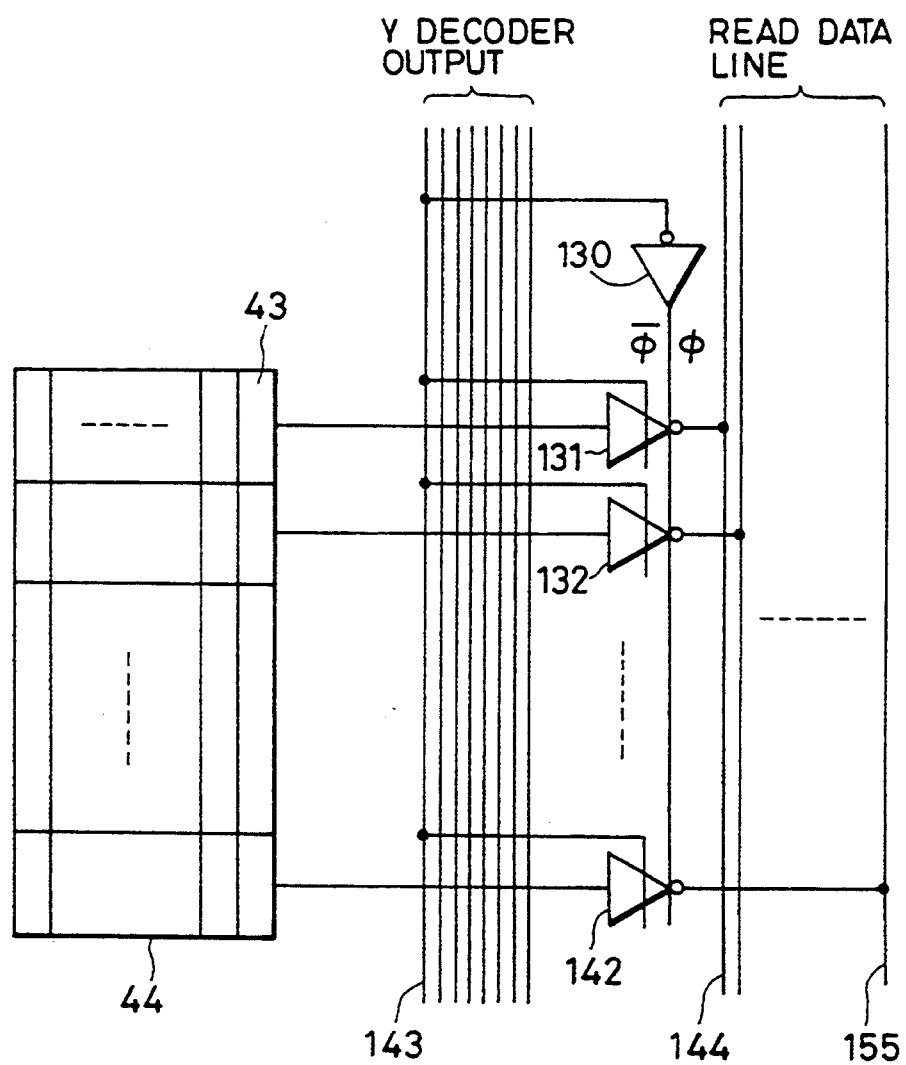
FIG. 11 is a circuit diagram of FIG. 10.

FIG. 10 shows a layout pattern wherein the tristate circuit of the bipolar CMOS composite shown in FIG. 8 is used in place of the transfer gates 54, etc. in FIG. 6 and the inverter circuit of the bipolar CMOS composite shown in FIG. 9 is used in place of the invertor 108 for controlling the tristate circuit or the like. FIG. 10 shows the read portion and represents the case where the Y decoder output is 8 words and the read data is 12 bits. The inverter 130 is placed at the uppermost position and twelve tristate circuits 131 to 142 are aligned below the former. Since the same number of the tristate circuits 131, etc. as the number of bits are necessary, one bit of the memory cell is aligned with the size in the Y direction. FIG. 11 shows the circuit diagram of FIG. 10 in order to have the latter more easily understood. However, the memory cell 43 is omitted in FIG. 10. FIG. 11 has fundamentally the same structure as FIG. 4 and can be therefore understood easily. This drawing will be explained briefly. When the signal 143 among the Y decoder outputs is "0" (the low active in FIG. 11, though it is the high active in FIG. 4), the output of the inverter 130, that is, the $\phi$ signal, becomes "1" and the tristate circuits 131 to 142 operate as the inverter circuit.

The data of the memory cell 43 among the memory cell block 44 which is determined by the X decoder is read out to the read data lines 144 to 155.

Turning back again to FIG. 10, like reference numerals are put to the patterns corresponding to the elements shown in FIGS. 8 and 9. In FIG. 10, dash line represents AL1, one-dot-chain line represents AL2, symbol ▨ represents a through-hole connecting AL1 to AL2, and symbol ⊠ represents a contact hole (hereinafter called "CONT") connecting AL1 to the drain, source or gate of MOS or to a resistor. Though other mask patterns and the like are necessary for fabricating LSI, they are omitted because they are irrelevant to the gist of the present invention. First of all, the structure of the inverter 130 will be described. A $V_{cc}$ potential is supplied to the collector of an NPN transistor 124 (hereinafter called "NPN") and to the source of PMOS 120 by 160 of AL1. The drain of PMOS 120, the resistor 122 and the base of NPN 124 are connected by 161 of AL1. The emitter of NPN 124, the resistor 122, the drain of NMOS 121 and the collector of NPN 125 are connected by 162 of AL1. This 162 of AL1 serves as the output terminal OUT of the inverter 130. PMOS 120 and the gate of NMOS 121 are connected by 163 of AL1 and serve as the input terminal IN. The source of NMOS 121, the resistor 123 and the base of NPN 125 are connected by 164 of AL1. The emitter of NPN 125 and one of the ends of the resistor 123 are connected to the ground potential by 165 of AL1.

Next, the structure of the tristate circuit 131 will be explained. The $V_{cc}$ potential is supplied to the collector of NPN 118 and to the source of PMOS 110 by 166 of AL1. The drain of PMOS 11, the drain of MNOS 114, one of the ends of the resistor 116 and the base of NPN 118 are connected by 167 of AL1. The emitter of NPN 118, one of the ends of the resistor 116, the source of NMOS 114, the drain of NMOS 112 and the collector of NPN 119 are connected by 168 of AL1. This 168 of AL1 is the output terminal (OUT) of the tristate circuit 131. The drain of NMOS 115, the source of NMOS 113, one of the ends of the resistor 117 and the base of NPN 119 are connected by 169 of AL1. The source of NMOS 115, one of the ends of the resistor 117 and the emitter of NPN 119 are connected by 170 of AL1. The gates of PMOS 110 and NMOS 114, 115 are connected mutually and serve as a $\tilde{\phi}$ terminal. This $\tilde{\phi}$ terminal makes it possible to extend 171 of AL1 by the maximum number of Y decoder outputs in the word×bit structure which is under the consideration, and to input the Y decoder output through TH. In the example shown in FIG. 10, the Y decoder output 143 is inputted to the $\tilde{\phi}$ terminal by TH 172, etc. The gates of PMOS 111 and NMOS 112 are mutually connected and serve as the input terminal IN and connected to the read data lines (not shown) of the momory. Incidentally, 173 of AL1 are alinged parallel in order to reduce the resistance of the gate electrode between PMOS 111 and NMOS 112. The output 162 of the inverter 130 becomes the $\phi$ signal, which is inputted to the $\phi$ terminal of the tristate circuits 131–142 (e.g. the gate of NMOS 113) through 174 of AL2 and TH 175, etc. The read data of the memory, or in other words, the outputs of the tristate circuits 131–142, can be wired freely except the portions occupied by the Y decoder output lines because the wide areas for the output terminals are secured as 168 of AL1. In the case of the example shown in FIG. 10, 12 bits or 12 wires are extended on the left side of the Y decoder output lines. The output of the tristate circuit 131 is wired in the Y direction by 144 of AL2 through TH 176.

Figure 12:
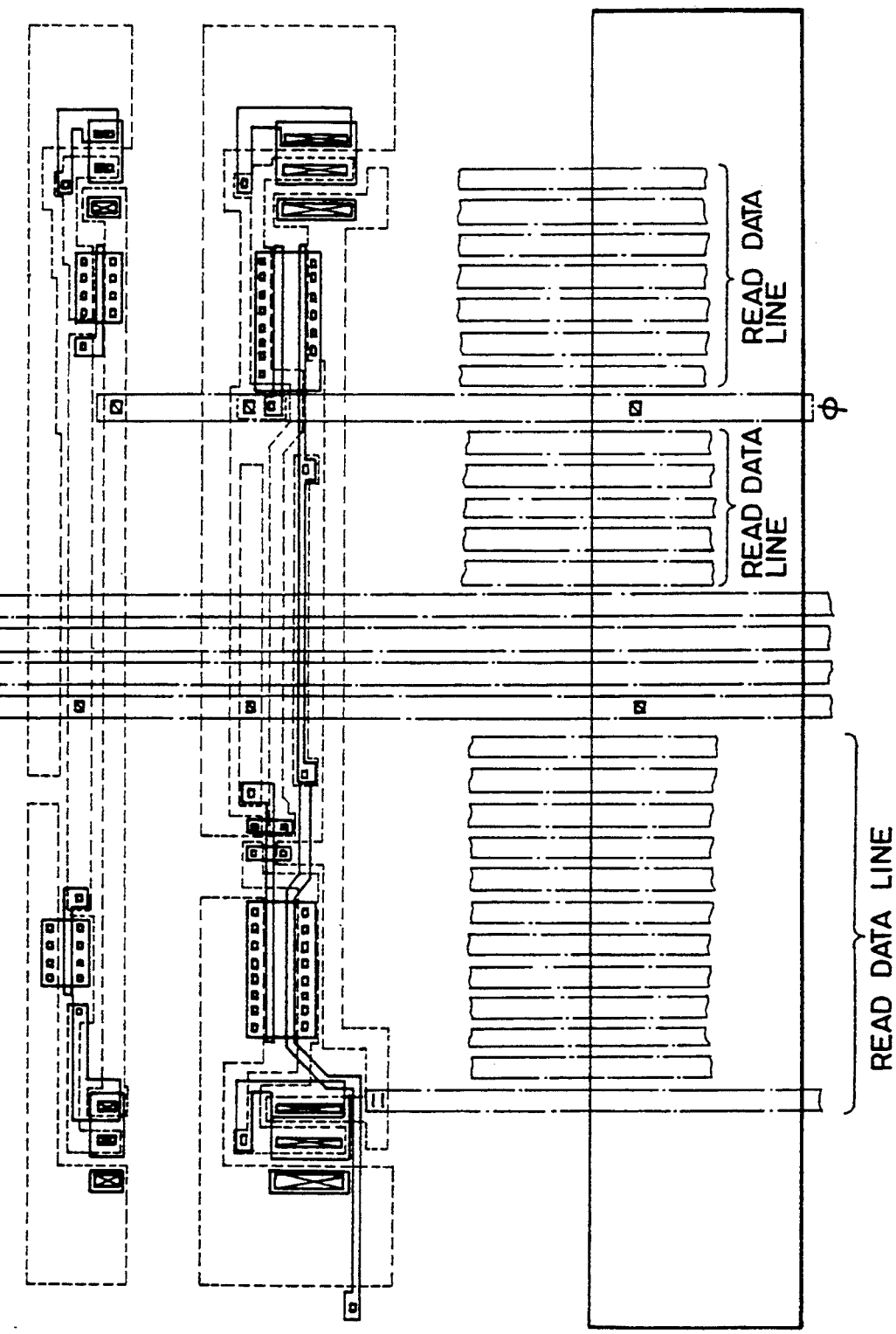
FIG. 12 is a layout pattern diagram (4 w×24 b) of the memory read portion of one embodiment of the present invention.

FIG. 12 shows an example wherein the Y decoder output is 4 words and the read data is 24 bits by merely changing the AL2 line and the position of disposition of TH in FIG. 10. The 8-word×12-bit structure is used in FIG. 10 but in the case of FIG. 12, the number of the Y decoder output lines is reduced from 8 to 4 but the number of the read data lines is increased from 12 to 24. Therefore, the wiring areas for the 32 lines will be necessary if the Y decoder output line areas and the read data line areas are secured exclusively in view of the variable structures of the 8-word×12-bit structure and the 4-word×24-bit structure. If the structure shown in FIG. 10 or 12 is employed, however, the Y decoder output line areas and the read data line areas are used in common when the word×bit structure changes, so that it is only necessary to secure the wiring areas for the 28 lines and the packaging efficiency of the RAM portions can be improved as a whole. In FIG. 10, the resistors 122, etc. between the base and emitter of the NPN transistors 124, etc. are composed of poly-Si. This poly-Si is formed simultaneously with the poly-Si at the upper part of the emitter when the emitter is formed. Accordingly, since the emitter and one of the ends of the resistor can be connected without using CONT, the occupying area can be reduced. Since the parasitic capacitance of the resistor is smaller than diffusion resistance, the structure contributes to a higher operation speed.

Figure 13:
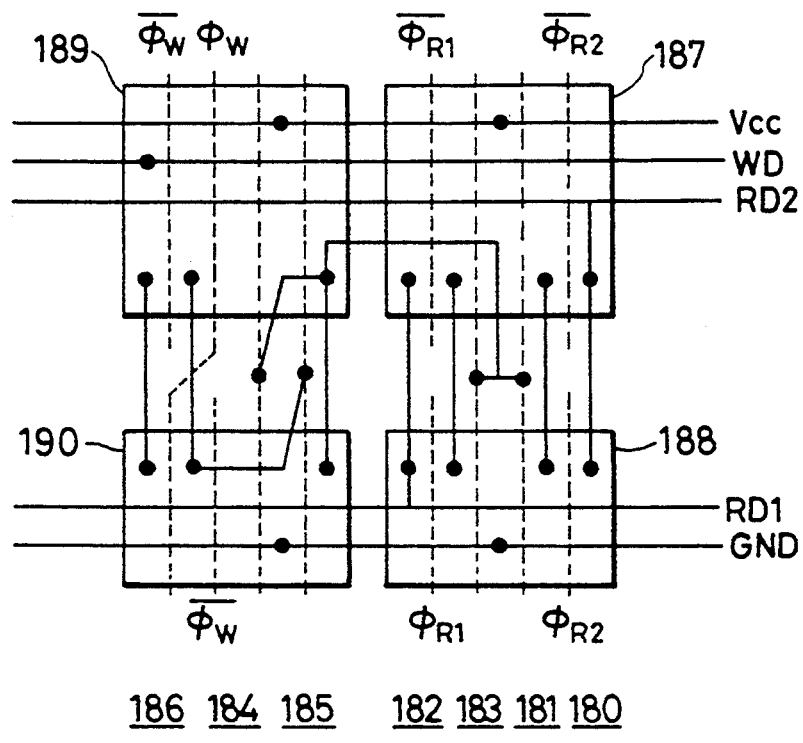
FIG. 13 is a pattern diagram of a 3-port memory cell in one embodiment of the present invention.
Figure 14:
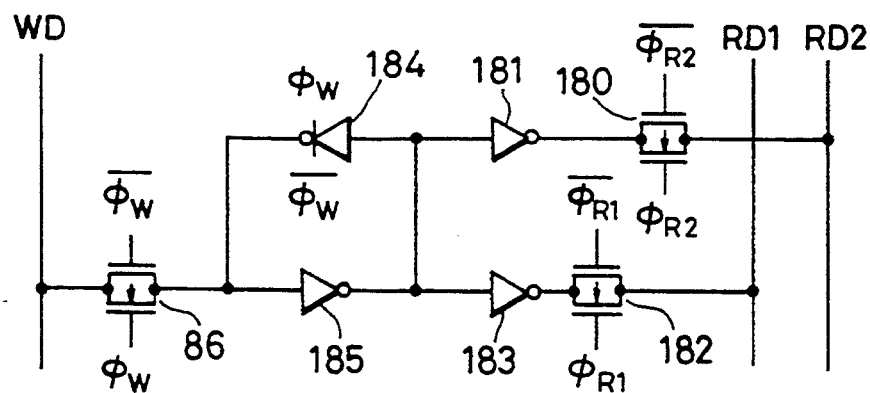
FIG. 14 is a circuit diagram of FIG. 13.

Next, the memory cell 43 will be explained. FIG. 13 shows the layout pattern of the 3-port RAM cell of the 1-write 2-read type and FIG. 14 shows its circuit diagram. First of all, this circuit diagram will be explained. A flip-flop structure consisting of an inverter 185 and a clocked inverter 184 stores memory information. When the memory cell is selected by an X decoder for read 1, $\phi_{R1}$ is "1" (with $\tilde{\phi}_{R1}$ being "0"), a transfer gate 182 is turned ON and the memory information is read out to an RD1 line. When the memory cell is selected by the X decoder for read 2, $\phi_{R2}$ is "1", the transfer gate 180 is turned ON and the memory information is read out to the RD2 line. Since the memory flip-flop and the read data lines RD1, RD2 are completely isolated by the inverter 181 or 183, the memory cell is free from the erroneous operation resulting from the charge share or from the size of transistors, and has high reliability. In the write operation, $\phi_W$ is "1", the transfer gate 186 is turned ON and the output of the clocked inverter 184 enters the high impedance state. Therefore, the data on the WD line is sent into the memory. Thereafter, $\phi_W$ is "0" and the data is stored in the flip-flop.

Next, the layout pattern of FIG. 13 will be explained. Dash line represents the gate of MOS, symbol is CONT connecting AL1 to the source, drain or gate of MOS and solid line is AL1. A P+ diffusion region 187 and an N+ diffusion layer 188 together form each element of the inverters 181, 183 and transfer gates 180, 182. A P+ diffusion region 189 and an N+ diffusion region 190 together form each element of the inverter 185, clocked inverter 184 and transfer gate 186. These circuit elements are connected by CONT and AL1 wiring as shown in the circuit diagram. When wiring is made, a greater number of wirings are disposed at the PMOS portions 187 and 189 in order to have the channel width of PMOS be greater than the channel width of NMOS without any unnecessary space. According to this arrangement, the current driving capacity of PMOS is made equal to that of NMOS, good balance can be established between the rise and fall of the signals and performance can be improved.

Figure 15:
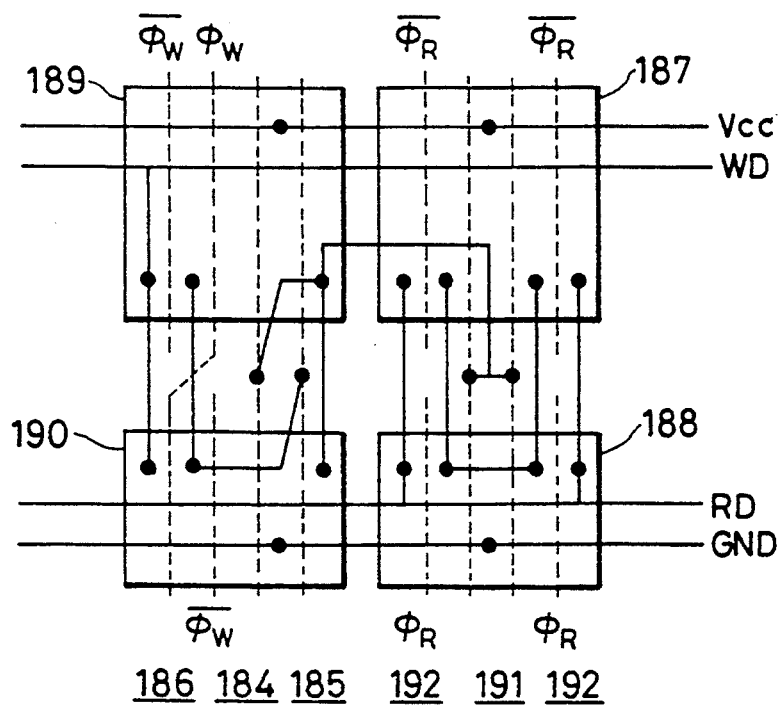
FIG. 15 is a pattern diagram of a 2-port memory cell in one embodiment of the present invention.
Figure 16:
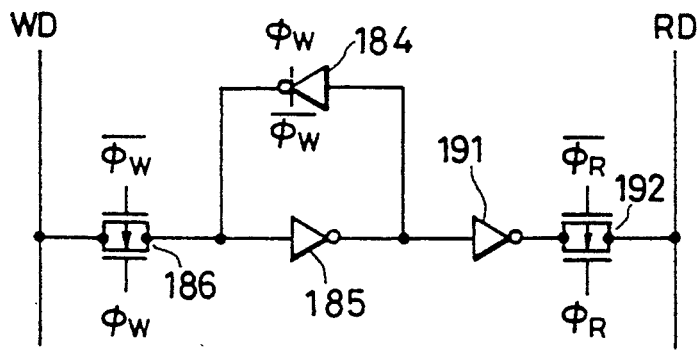
FIG. 16 is a circuit diagram of FIG. 15.

FIG. 15 shows an example wherein a 1-write 1-read 2-port RAM cell is constituted by changing the pattern of CONT and AL1 in FIG. 13, that is, the custom mask of the gate array LSI. FIG. 16 shows its circuit diagram. Like reference numerals are used to identify like constituents as in FIG. 13 or 14. The difference of FIG. 15 (FIG. 16) from FIG. 13 (FIG. 14) lies in the wiring of the inverter 191 at the read portion and the wiring of the transfer gate 192. In this case, since the element size is doubled by parallel connection, the read time can be improved to a higher level.

Figure 17:
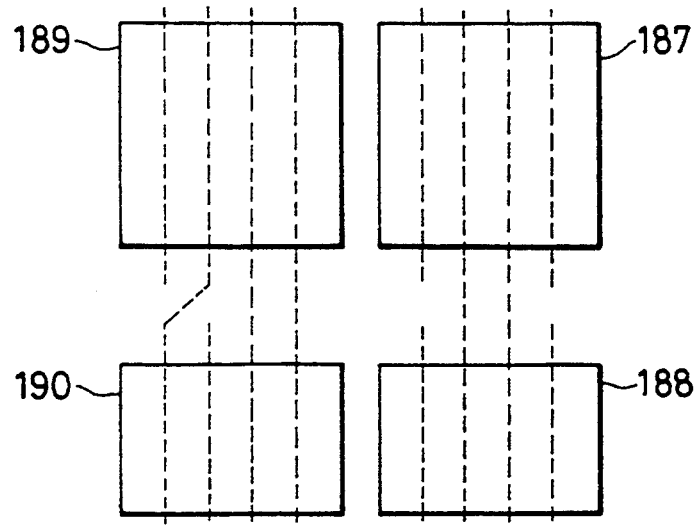
FIG. 17 is a base pattern of FIG. 13.

Therefore, if the device pattern shown in FIG. 17 is available, the memory having a variable number of ports can be constituted by changing the custom mask of the gate array. In other words, versatility can be improved.

Figure 18:
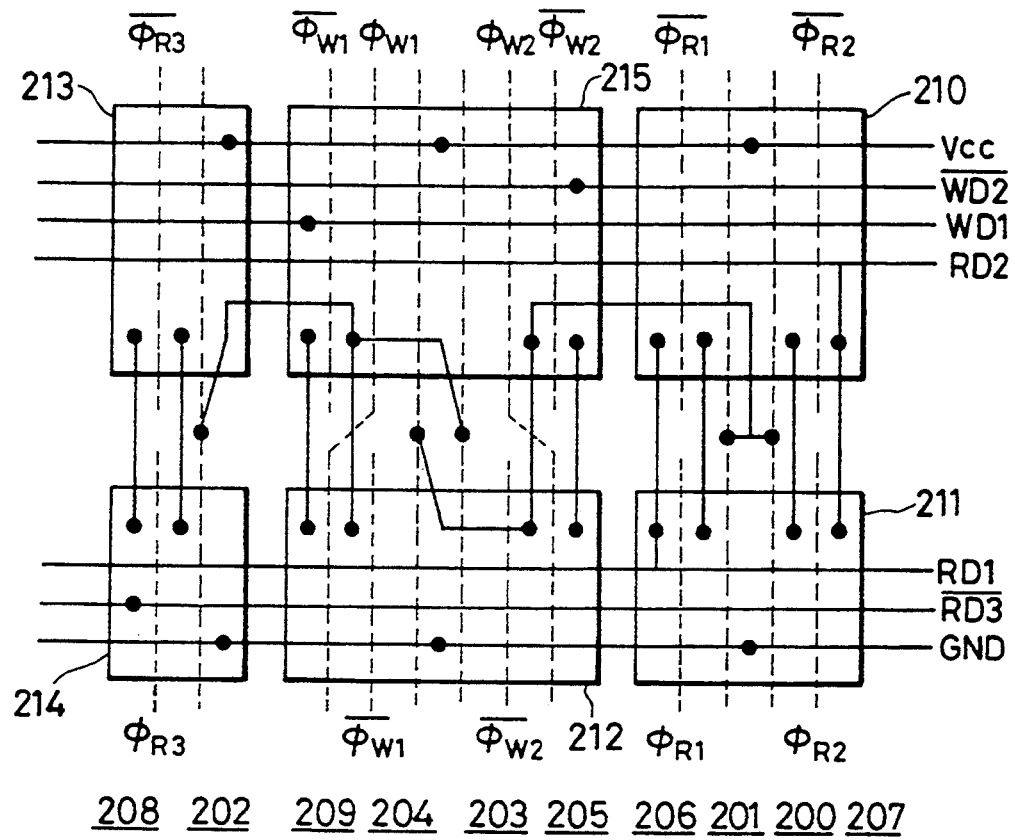
FIG. 18 is a pattern diagram of a 5-port memory cell in one embodiment of the present invention.
Figure 19:
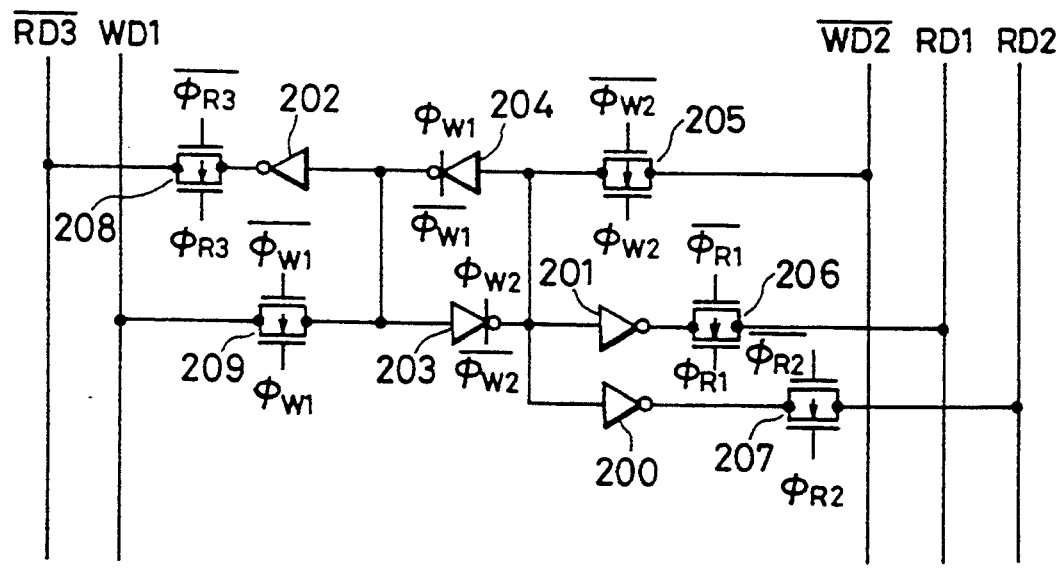
FIG. 19 is a circuit diagram of FIG. 18.

FIG. 18 shows the layout pattern of a 2-write, 3-read 5-port RAM cell. FIG. 19 shows its circuit diagram. First of all, the circuit diagram will be explained. Memory information is stored by a flip-flop structure consisting of clocked inverters 203 and 204. When the memory cell is selected by an X decoder for read 1, $\phi_{R1}$ is "1", a transfer gate 206 is turned ON and the memory information read out to an RD1 line. The read operation to RD2 and $\overline{RD}3$ lines are made in the same way. During the write operation of WD1, $\phi_{w1}$ is "1", the transfer gate 209 is turned ON and the output of the clocked inverter 204 is under the high impedance state. Therefore, the data on the WD1 line is sent into the memory. Thereafter, $\phi_{w1}$ is "0" and the data is stored in the flip-flop.

In FIG. 18, like reference numerals are used as in FIG. 13. The P+ diffusion region 210 and the N+ diffusion layer 211 together form the inverters 200, 201 and the transfer gates 206, 207. The P+ diffusion layer 215 and the N+ diffusion layer 212 together form the clocked inverteros 203, 204 and the transfer gates 205, 209. The P+ diffusion region 213 and the N+ diffusion layer 214 together form the invertor 202 and the transfer gate 208. Each of these elements is connected by CONT and AL 1 wiring as shown in the circuit diagram. In this wiring, too, the same effect as in FIG. 13 is obtained by securing the wider width for the channel of PMOS than that of NMOS. The gate array having such a multi-port memory can be applied effectively to the register file of an operation circuit portion of a minicomputer and for the purpose of accomplishing LSI of its peripheral circuit.

Figure 20:
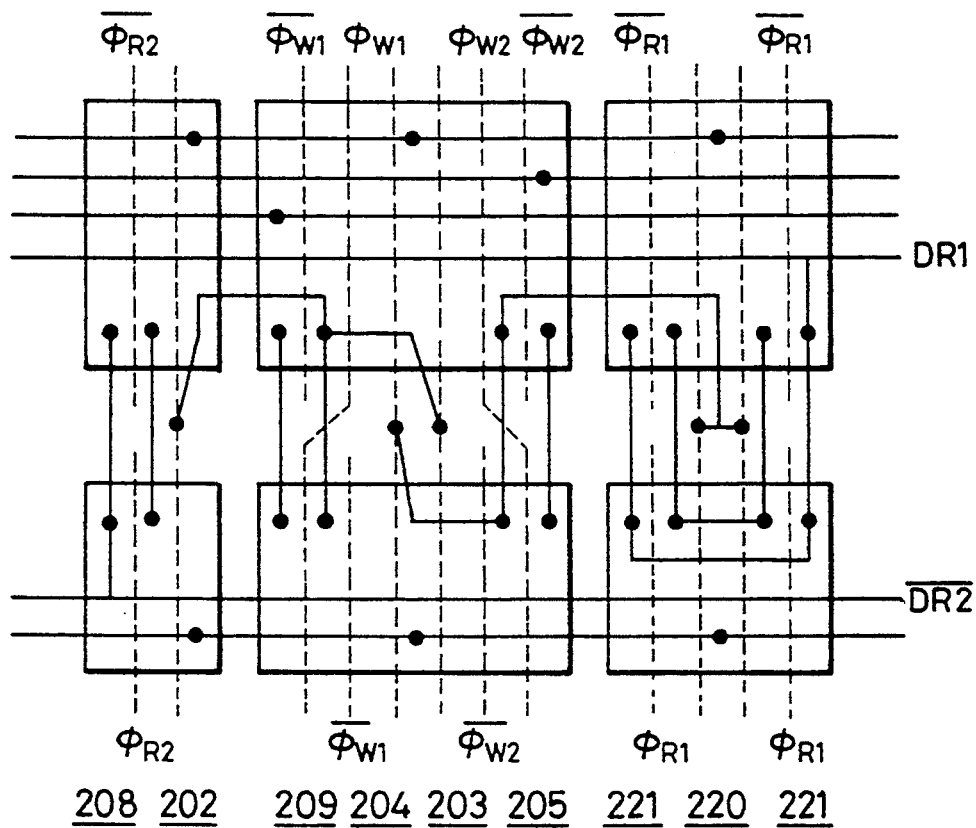
FIG. 20 is a pattern diagram of a 4-port memory cell in one embodiment of the present invention.
Figure 21:
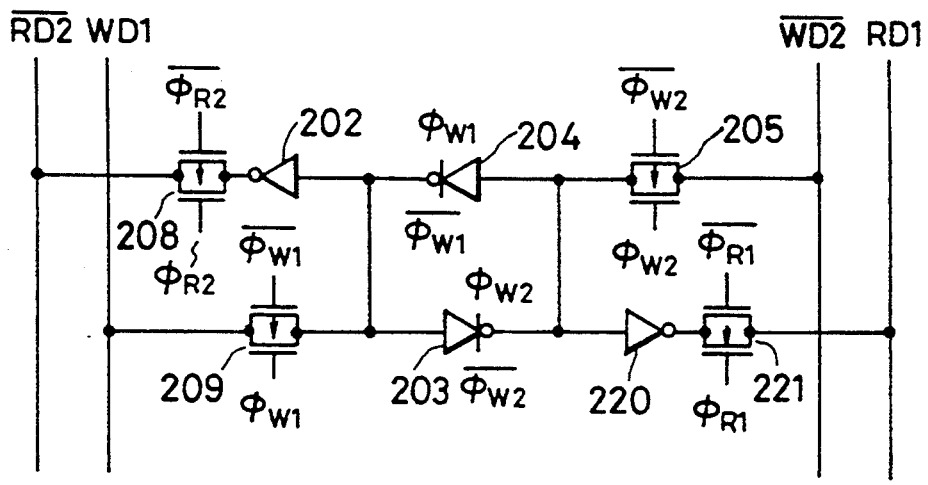
FIG. 21 is a circuit diagram of FIG. 20.

FIG. 20 shows an example of a 2-write, 2-read 4-port RAM cell structure by changing the patterns of CONT and AL1 in FIG. 18. FIG. 21 shows its circuit diagram. Like reference numerals are used to identify like circuit elements as in FIG. 18 or 19. The difference of FIG. 20 (FIG. 21) from FIG. 18 (FIG. 19) lies in the wiring of the inverter 220 and transfer gate 221 in the read portion. In this case, the read time can be sped up because the element size is doubled by parallel connection.

Therefore, if a pattern obtained by deleting CONT and AL1 from FIG. 18 or 20 is available, the number of memory ports can be made variable by changing the kind of custom mask of the gate array so that a high versatile memory with a built-in array can be accomplished without delaying the turn-around time.

Figures 22, 23:
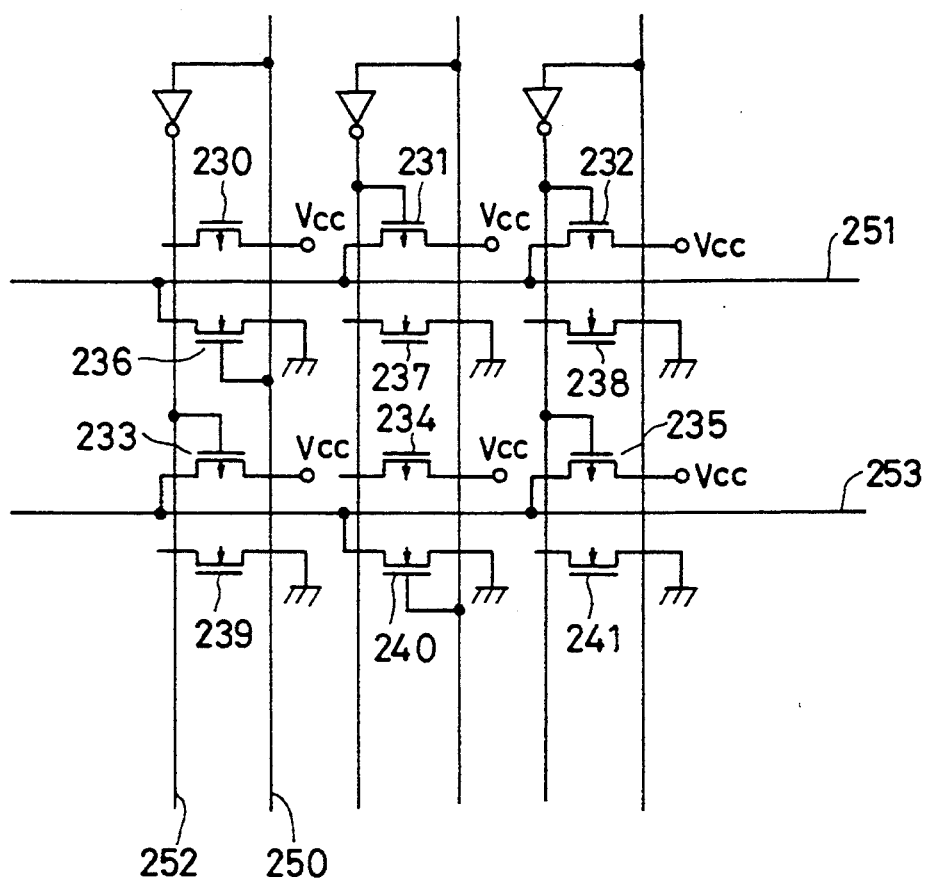
FIG. 22 is a circuit diagram of ROM in one embodiment of the present invention.
FIG. 23 shows data information of FIG. 22.

FIG. 22 shows an example of 3-word×2-bit ROM consisting of PMOSs 230–235 and NMOSs 236–241. For instance, PMOS 230 and NMOS 236 constitute one bit. The pair of PMOS 230 and NMOS 236 has the same address as the pair of PMOS 233 and NMOS 239. As to the bit for storing "0" (e.g. the pair of PMOS 230 and NMOS 236), the gate of NMOS 236 is connected to the high active decoder output line 250 and the drain is connected to the data line 251. The gate and drain of PMOS 230 are made open. As to the bit for storing "1" (e.g. the pair of PMOS 233 and NMOS 239), on the contrary, the gate of PMOS 233 is connected to the inversion line 252 of the high active decoder output line 250 and its drain is connected to the data line 253. The gate and drain of NMOS 239 are made open. Therefore, the data memory state in FIG. 22 becomes such as shown in FIG. 23.

Figure 24:
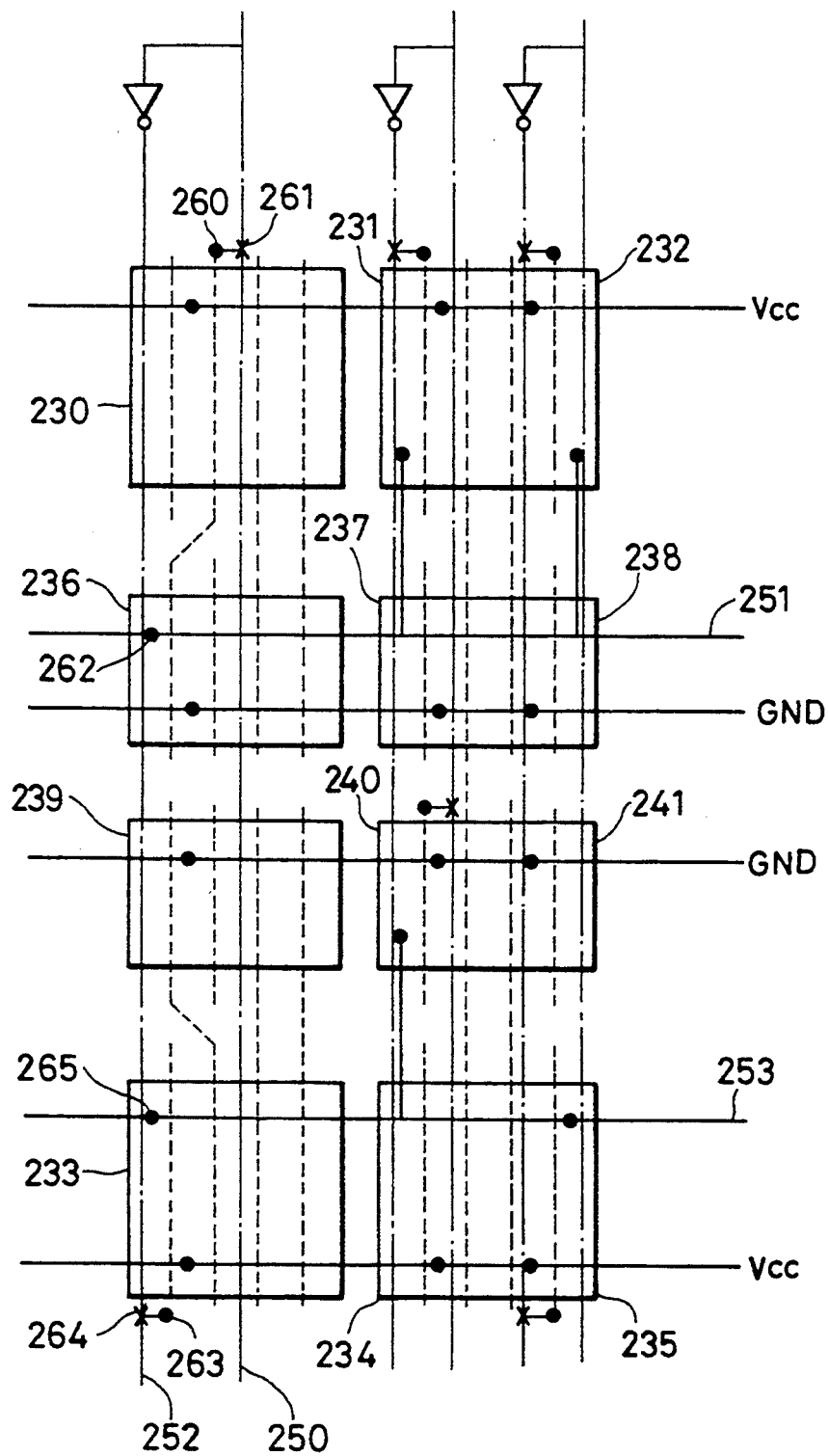
FIG. 24 is a planar pattern diagram of FIG. 22.

FIG. 24 shows the planar pattern of the memory cell portion of FIG. 22. Dash line represents the gate electrode, solid line is AL1, symbol is CONT connecting AL1 and the source, drain and gate of MOS, and one-dot-chain line is AL2 and symbol X is TH connecting AL1 and AL2. Like reference numerals are used in this drawing to identify like circuit elements as in FIG. 2. The gate of NMOS 236 is connected to the decoder output 250 through CONT 260 and TH 261 and the drain of NMOS 236 is connected to the data line 251 through CONT 262. The gate of NMOS 233 is connected to the decoder inversion output 252 through CONT 263 and TH 264 and the drain of NMOS 233 is connected to the data line 253 through CONT 265. This also holds true of the other bits.

The important point here is that the pattern obtained by deleting CONT, AL1, TH and AL2 from FIG. 24 or in other words, the custom mask of the gate array, is the same as that of FIG. 17. Namely, though FIG. 17 shows the base pattern of 3-port RAM, ROM can be formed by the same pattern by changing the custom mask. In this embodiment, ROM for 3 bits can be formed by one bit of 3-port RAM. Therefore, if the base pattern of FIG. 17 is available, RAM or ROM can be constituted and versatility can be improved.

Figure 25:
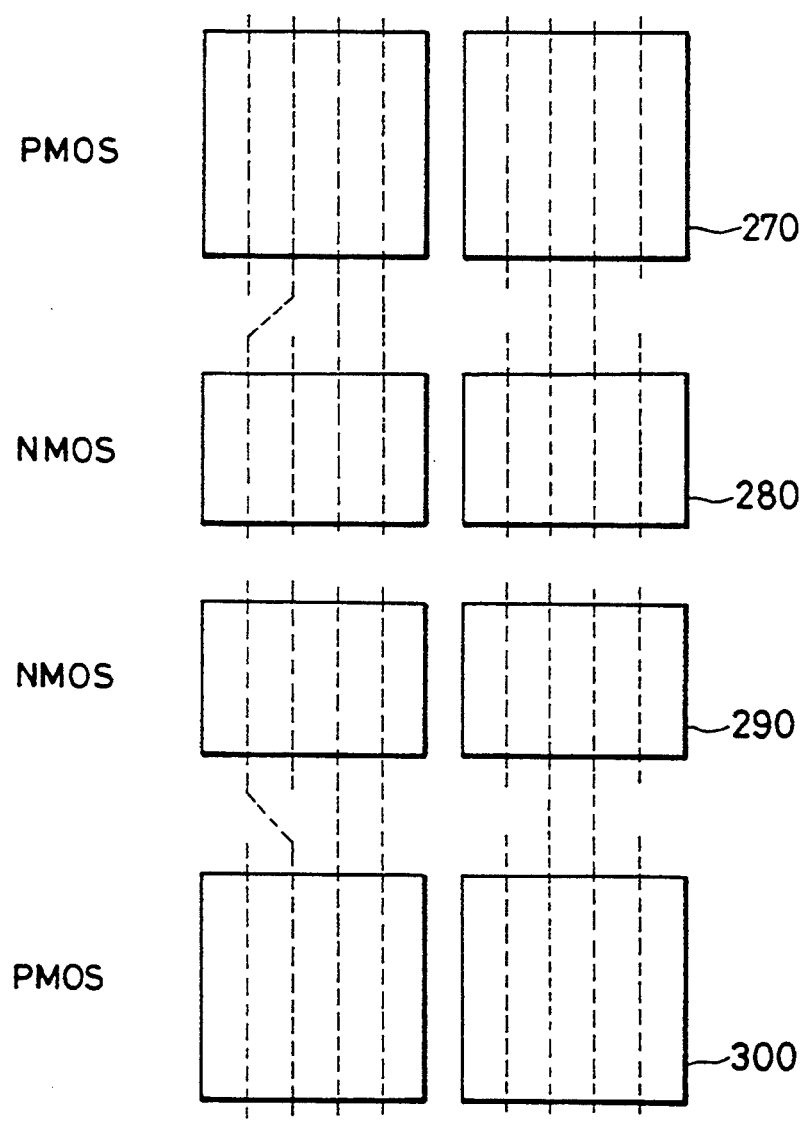
FIG. 25 is a view showing the disposition of a base pattern of a memory cell.

FIG. 25 shows the pattern obtained by omitting the custom mask pattern from FIG. 24. This is the mirror-inversion pattern of FIG. 17 with respect to the X axis. The sequence of arrangement becomes PMOS, NMOS, NMOS, PMOS, PMOS, NMOS, . . . , and the like. A relatively large spacing must be secured between MOSs having mutually different conductivity types in view of latch-up and P-N junction withstand voltage but the spacing can be considerably reduced between MOSs having the same conductivity type. For example, there are the differences of 6 $\mu$m and 1.4 $\mu$m. Therefore, the memory size in the Y direction can be reduced drastically, the wiring capacity can be reduced and the high operation speed can be accomplished.

Figure 26:
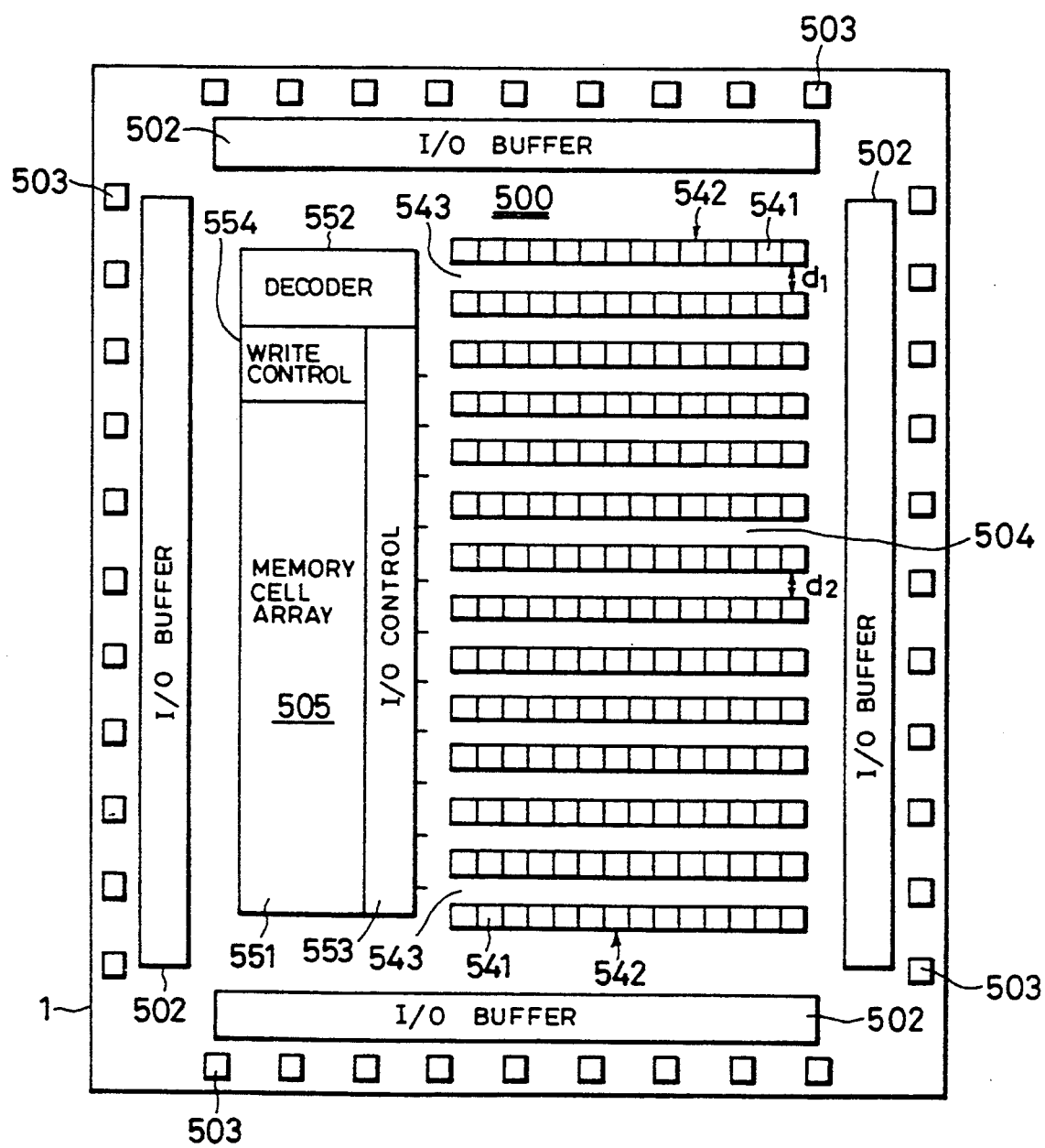
FIG. 26 is a view showing the outline of the layout structure of a semiconductor integrated circuit device in another embodiment of the present invention.

FIG. 26 shows the outline of the layout structure of the semiconductor integrated circuit device in accordance with still another embodiment of the present invention.

In the semiconductor integrated circuit device 1 shown in this drawing, an internal circuit portion 500 is formed at the center of the semiconductor substrate, an I/O buffer portion (input/output buffer portion) 502 is formed around the former and a terminal pad portion 503 is disposed around the outer periphery of the I/O buffer portion 502.

The internal circuit portion 500 is substantially square and its layout region is halved into right and left portions. A gate array portion 504 is disposed on the right while a memory circuit portion 505 is disposed on the left.

The gate array portion 504 has a large number of basic cells 541. The content of this basic cell 541 is standardized in advance. The circuit elements wired in an arbitrary circuit by wirings are formed in each basic cell 541 in the form of a semiconductor base pattern. A large number of basic cells 541 are arranged in the row direction to form a cell array 542. The cell arrays 542 and the wiring regions 543 are alternately arranged in the column direction to form a gate array portion 4. The width of the wiring region 543 is not constant and the width d2 at the position aligned with the same line as the data input/output portion of the memory circuit portion 500 is made selectively greater than the width d1 at the other portions.

On the other hand, the memory circuit portion 505 is disposed adjacent to the gate array 504 and its data input/output portion is positioned on the side of the gate array portion 504 described above. This memory circuit portion 505 consists of RAM (Random Access Memory) and includes a memory cell array 51, a decoder 552, an I/O control (input/output control) portion 553 and a write control portion 554. The I/O control portion 553 makes input/output control of the memory data and is formed at the extreme left of the wiring region 543 on the side of the gate array 504 described above. This memory circuit portion 505 has a plurality of word-bit (1 word/32 bits) memory structure and has 1-bit parity bit for each word. Furthermore, the memory circuit portion 505 consists of RAM which is multi-selected by a plurality of sets of selection circuits and the data input/output portion.

Figure 27A:
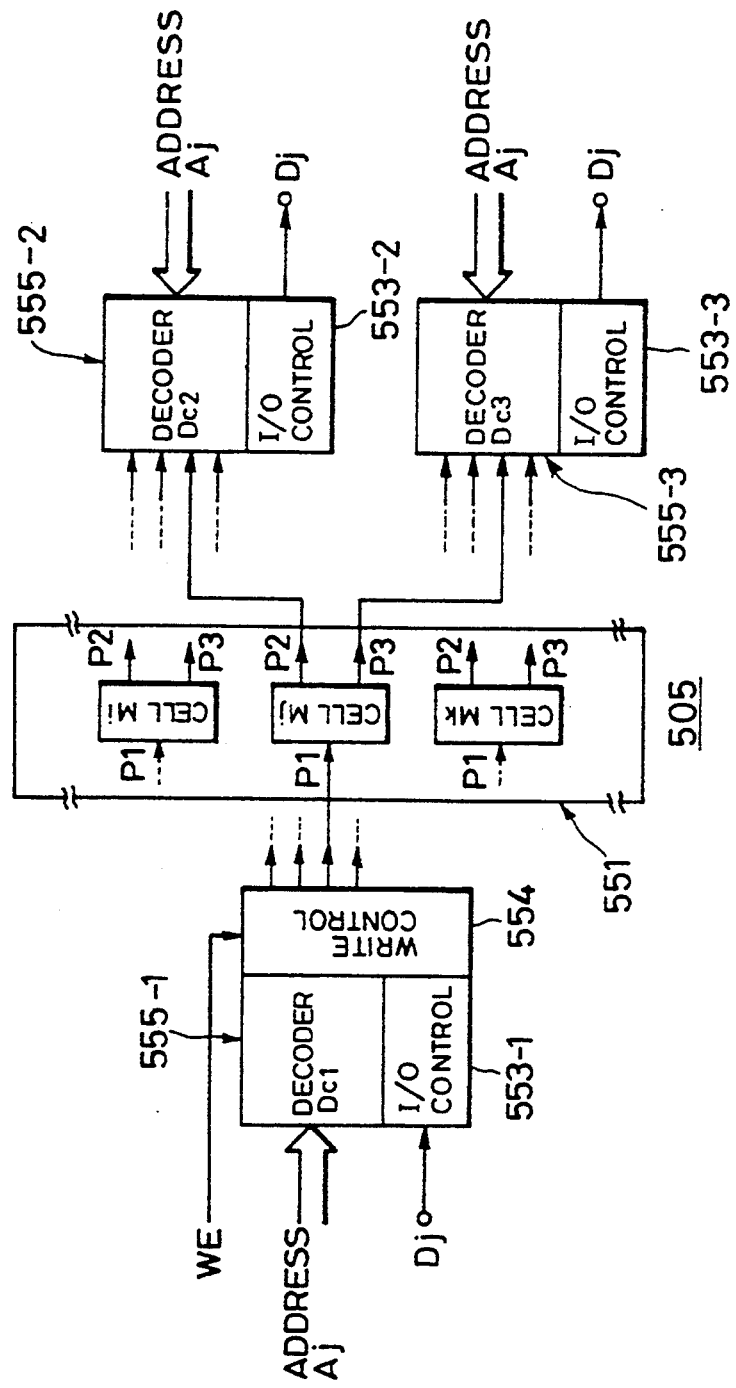
FIGS. 27(a) and 27(b) are block diagrams showing the concept of a multi-selection system memory circuit portion.

FIGS. 27(a) and (b) show the concept of multi-selection RAM constituting the memory circuit portion 505 described above.

In the multi-selection system memory circuit portion 505 shown in FIGS. 27(a) and (b), each memory cell Mi, Mj, Mk has three data ports P1, P2, P3. It has three systems of selection circuits 555-1, 555-2, 555-3 in order to select independently each data port P1, P2, P3. A decoder Dc1, Dc2, Dc3 and an I/O control portion 553-1, 553-2, 553-3 are disposed in each selection circuit 555-1, 555-2, 555-3. A write control portion 554 is disposed in the selection circuit 555-1 which is set exclusively for write-only. This write control portion 554 controls the write operation by a write control signal (write enable) WE inputted together with the address signal Ai.

In this multi-selection system memory circuit portion 505, one arbitrary memory Mj cell can be selected for access simultaneously by applying the same address signal Aj to the three systems of selection circuits 555-1, 555-2, 555-3, as shown in FIG. 27(a), for example. As shown in (b), arbitrary three memory cells Mi, Mj, Mk can be selected for access simultaneously by applying separate address signals Ai, Aj, Ak to the selection circuits 555-1, 555-2, 555-3.

Figure 27B:
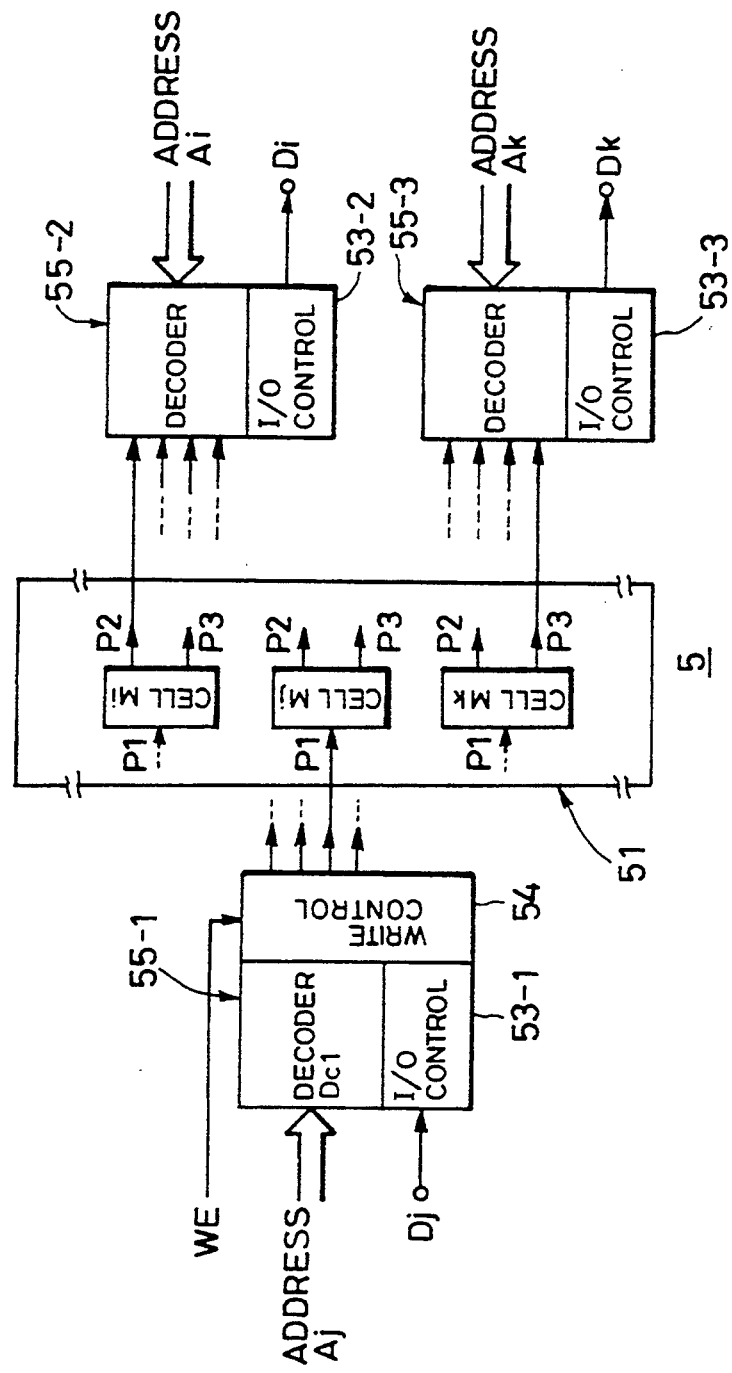
Figure 28:
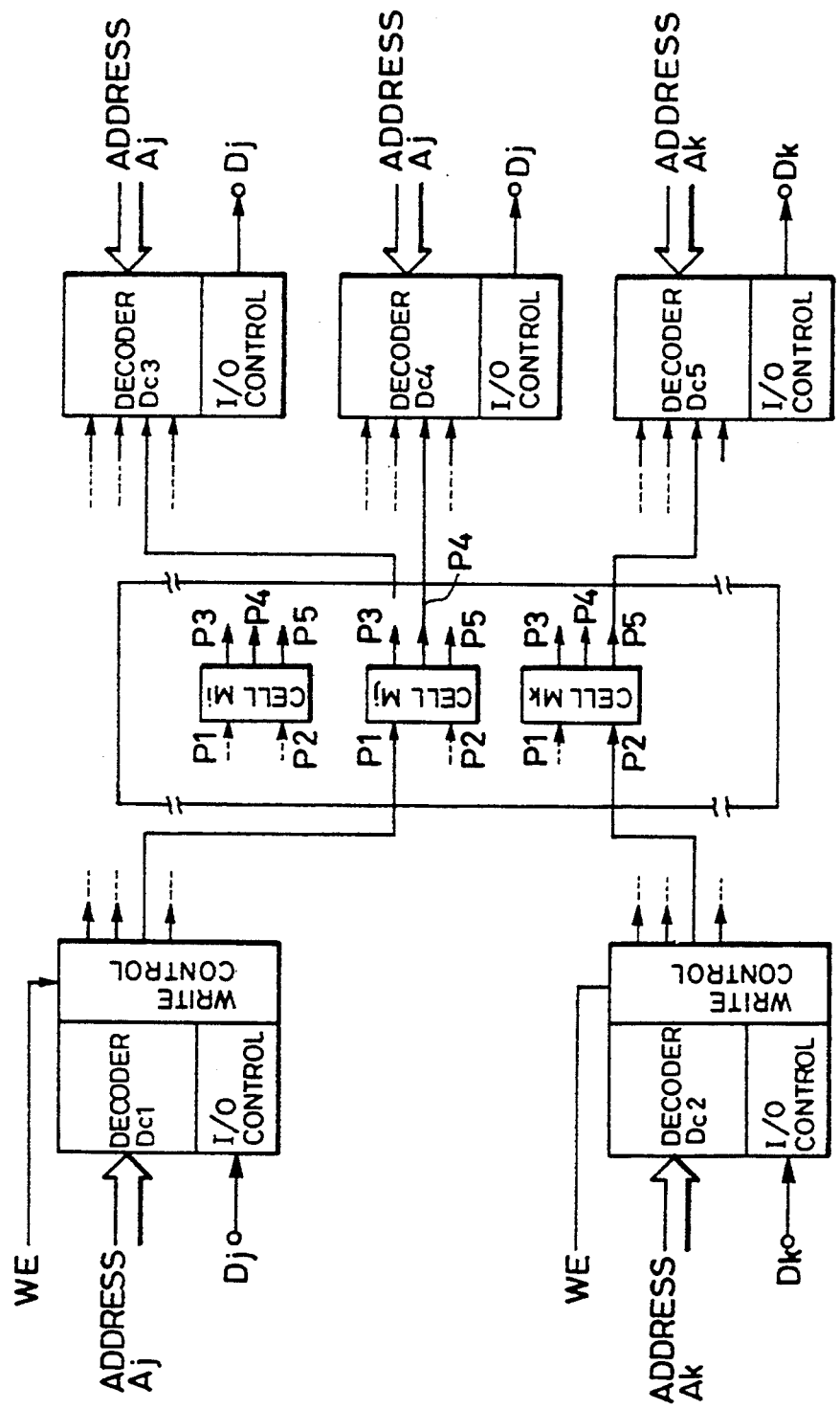
FIG. 28 is a block diagram showing an example of a memory cell which is selected quintuplly.

Incidentally, though FIG. 27 shows an example of the memory cell which is triply selected, this embodiment can be applied to the ordinary memory circuit portion of the multi-selection system such as the quintple-selection memory cell shown in FIG. 28.

Figure 29:
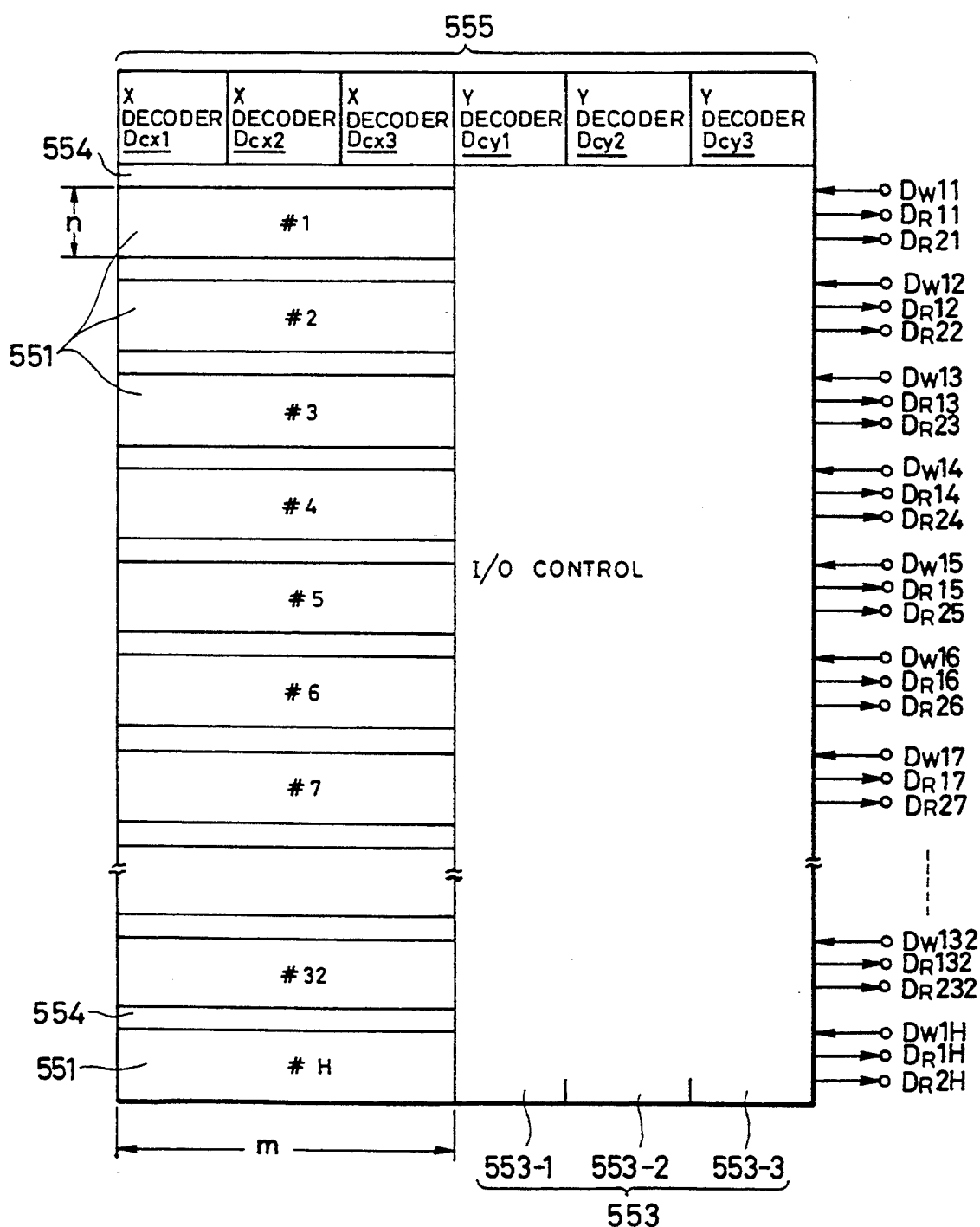
FIG. 29 is a view showing the outline of the layout structure of a memory circuit portion.

FIG. 29 shows the outline of the layout structure in the memory circuit portion 505 described above.

In the drawing, the memory cell array 551 consists of memory mats #1–#H on the H surface. Memory cells of m × n bits are disposed on each memory mat #1–#H. The write control portion 554 is disposed for each memory mat #1–#H.

Three sets of X decoders Dcx1, Dcx2, Dcx3 and Y decoders Ycy1, Ycy2, Ycy3 are disposed as the selection circuit 555 (555-1, 555-2, 555-3) on the memory cell array 551. These three sets of decoders Dcx1, Dcx2, Dcx3 and Dcy1, Dcy2, Dcy3 select triply the memory cells in each memory mat #1–#H.

The I/O control portion 553 (553-1, 553-2, 553-3) is disposed on the right side of the memory cell array 551. The memory data Dw11–DwiH, Dr11–DR1H, DR21–DR2H are inputted and outputted from this I/O control portion 553. In this case, the data Dw11 to Dw1H are write data and the write address is designated by the decoder Dcx1–Dcy1. The data Dw11–Dw1H and Dw21–Dw2H are read data and the read address is designated by the decoder Dcx2–Dcy2 and Dcx3–Dcy3, respectively.

The memory data Dw11–Dw1H, Dr11–Dr1H, Dr21–Dr2H are inputted and outputted in the word unit using 32 bits per word, for example. One-bit parity is added to each word. Therefore, the data input/output unit is 32+1=33 bits, in this case.

Figure 30:
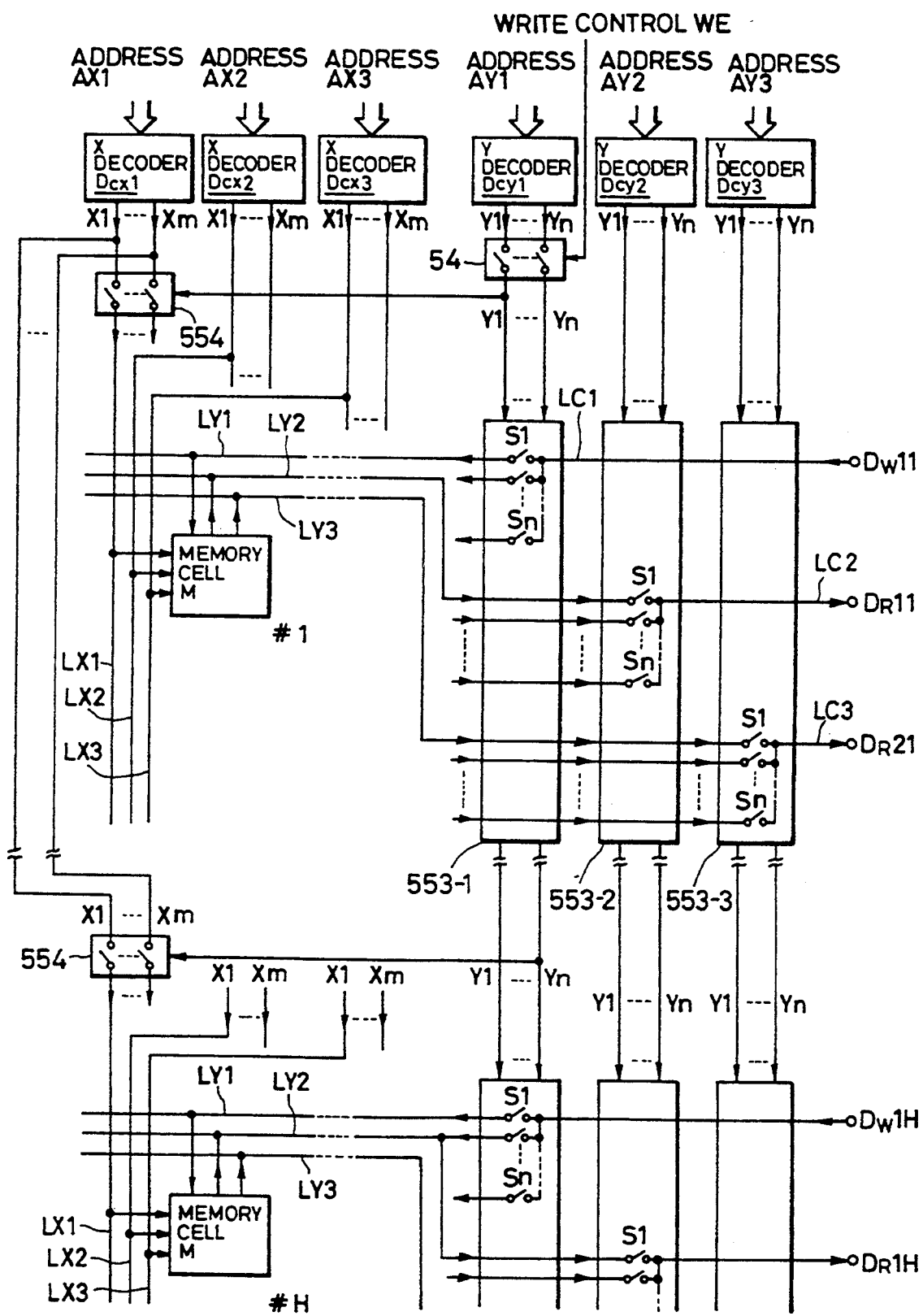
FIG. 30 is a circuit diagram showing partially the structure of the memory circuit portion.

FIG. 30 shows partially the circuit construction of the memory circuit portion 505 described above.

As shown in the drawing, three systems of X selection lines LX1, LX2, LX3 and Y selection lines LY1, LY2, LY3 are connected to each memory cell M. The X selection lines LX1, LX2, LX3 are wired in the number m for each memory mat in the row direction. The Y selection lines LY1, LY2, LY3 are wired in the number n for each memory mat #1–#H in the column direction.

The X selection lines LX1, LX2, LX3 are selectively selected by the X decoders Dcx1, Dcx2, Dcx3. The Y selection lines LY1, LY2, LY3 are selectively selected by the Y decoders Dcy1, Dcy2, Dcy3 through the I/O control portions 553-1, 553-2, 553-3.

Address signals AX1, AX2, AX3 and AY1, AY2, AY3 are inputted to each decoder Dcx1, Dcx2, Dcx3 and Dcy1, Dcy2, Dcy3, respectively.

The X decoders Dcx1, Dcx2, Dcx3 decode the address siganls AX1, AX2, AX3 and output the selective X selection signals X1–Xm. The X selection lines LX1, LX2, LX3 are selected and driven by this X selection signal X1–Xm.

The Y decoders Dcy1, Dcy2, Dcy3 decode the address signals AY1, AY2, AY3 and output the selective Y selection signals Y1–Ym. The Y selection switches S1–Sn in the I/O control portions 553-1, 553-2, 553-3 are selected by this Y selection signal so that the Y selection lines LY1, LY2, LY3 are selected and connected to the common data lines LC1, LC2, LC3. The common data lines LC1, LC2, LC3 are disposed for each bit of the input/output data.

In this case, the selection signals X1–Xm outputted from the write-only X decoder Dcx1 is given to the X selection line Lx1 from the write control portion 554 through each memory mat #1–#H. The selection signals Y1–Yn outputted from the write-only Y decoder Dcy1 is given to the Y selection line Ly1 through the write control portion 54 which is in common for each memory mat #1–#H.

Figure 31:
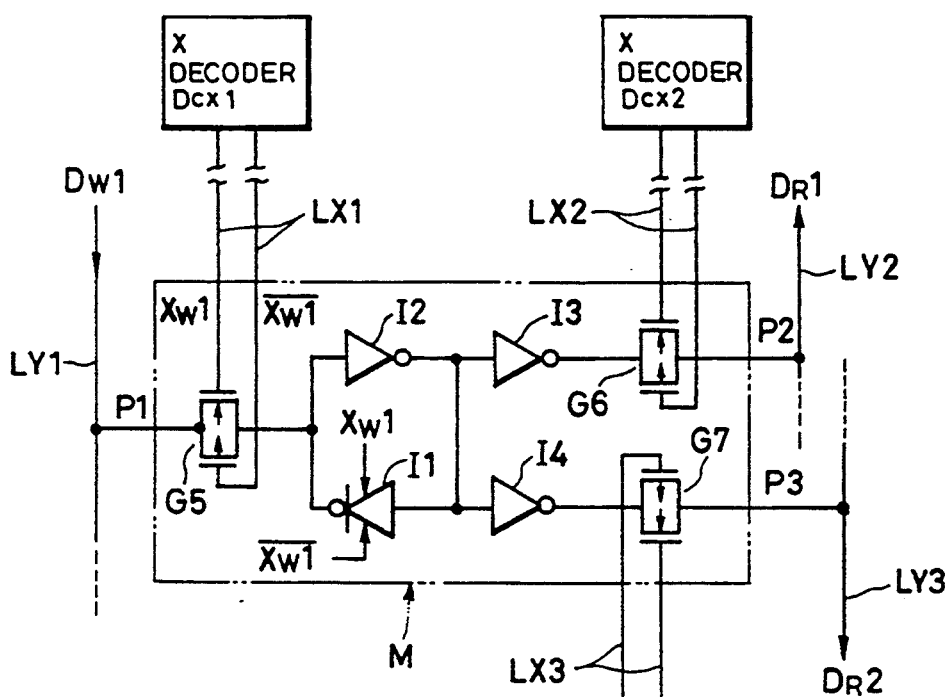
FIG. 31 is a circuit diagram showing an example of the structure of a memory cell which is multiplely selected.

FIG. 31 shows a structural example of the memory cell M described above.

The memory cell M shown in the drawing is constituted for multi-selection by one write data port P1 and two read data ports P2, P3, and consists of four inverters 11, 12, 13, 14 and three transfer gates G5, G6, G7.

The inverters 11 and 12 forms a 1-bit data retention circuit by a D.C. positive feedback loop. The data held by this retention circuit is given from the Y selection line LY1 through the transfer gate G5. On the other hand, the retention data of the retention circuit Dr1, Dr2 is outputted to the Y selection lines LY2, LY3 through the inverters 13, 14 and the transfer gates G2, G3.

The transfer gate G5, G6, G7 consists of CMOS transistors that are connected in parallel with one another. The transfer gates G5, G6, G7 are selectively turned ON and driven by the X selection signal given from the X Dcx1, Dcx2, Dcx3 through the X selection line LX1, LX2, LX3.

In this case, among the inverters 11 and 12 forming this data retention circuit, one 12 of the inverters is of a tristate type. The selection signal Xw1 from the write X decoder Dcx1 turns ON and drives the transfer gate G5 and sets the output of the tristate type inverter 11 to the high impedance state. Accordingly, the retention data of the data retention circuit including this tristate inverter 11 is re-written to the data Dw1 given from the Y selection line LY1 through the data transfer gate G5.

Figure 32:
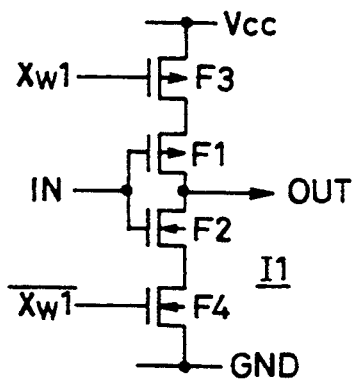
FIG. 32 is a circuit diagram showing part inside the memory circuit.

As shown in FIG. 32, the tristate inverter 11 consists of two sets of P-channel MOS transistors F1, F3 and N-channel MOS transistors F2, F3. F1 and F2 constitute a CMOS inverter portion. Symbol in represents the inverter input while symbol out represents the inverter output. F3 and F4 switch and control the operation power source $V_{cc}$-GND of their inverter portion. When the X selection signal Xw1 is applied to each gate of F3 and F4, the inverter output out can be set to the neutral state of the high impedance.

Figure 33:
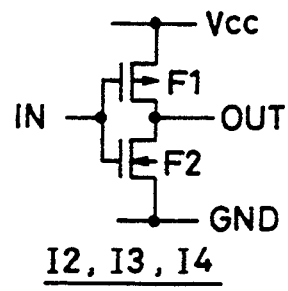
FIG. 33 is a circuit diagram showing other part in the memory circuit.

The other inverters 12, 13, 14 consists only of the CMOS transistors F1, F2 as shown in FIG. 33.

Figure 34:
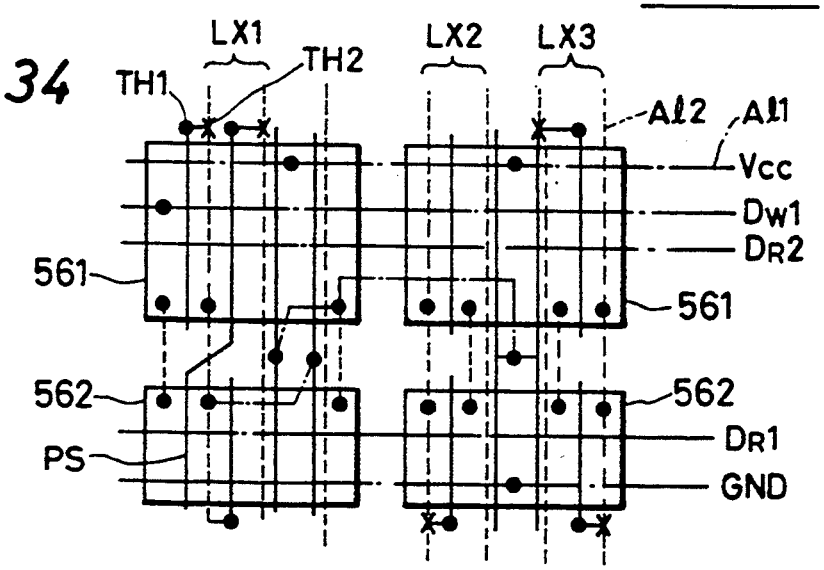
FIG. 34 is a view showing an example of a wiring pattern of the memory cell.

As shown in FIG. 34, the memory circuit M described above can be formed by using two islands 561 of the n-conductivity type diffusion layer and two islands of the n-conductivity type diffusion layer. In the drawing, symbol PS represents a poly-si gate electrode, Al1 is a first layer aluminum wiring, Al2 is a second layer aluminum wiring and TH1 and TH2 are contact portions for the inter-level wiring.

The construction of the memory circuit portion 505 described above can be selected arbitrarily by wirings of the circuit elements prepared in the form of the circuit base such as the diffusion layers in the same way as the gate array portion 504 described above. For example, in the embodiment described above, one word consists of (32+1) bits but it can be composed of (8+1) bits or (16+1) bits arbitrarily by merely designing the wirings. In other words, the memory circuit portion 505, too, in this embodiment can be constituted by a so-called "master slice system".

In the other embodiment of the invention described above, the gate array portion 504 and memory circuit portion 505 in the semiconductor integrated circuit device are disposed adjacent to each other and the data input/output portion of the memory circuit portion 504 is disposed on the side of the gate array portion 504. According to this arrangement, connection between the gate array portion 504 and the memory circuit portion 505 can be made extremely tightly so that the interconnection between the gate array portion 504 and the memory circuit portion 505 can be reinforced and high functions, which cannot be accomplished if they are formed separately, can be attained.

If the memory circuit portion 505 described above is of the multi-selection type, pipeline processing can be made by making read and write to the memory circuit portion 505 simultaneously and the processing speed can be thus improved.

Since the write and read operations can be made simultaneously in the memory circuit portion 505 of the multi-selection system, it can be used as a register. Therefore, a microprocessor with a large number of built-in registers or other processing units can be constituted arbitrarily by the master slice system.

Though the present invention has thus been described definitely with reference to the embodiments thereof, the present invention is not limited thereto, in particular, but can of course be changed or modified in various manners without departing from the spirit and scope thereof. For example, the memory circuit portion described above may be composed of ROMs either partially or as a whole.

Though the description given above primarily deals with the application of the present invention to the gate array as the background and field of utilization thereof, the application is not particularly limited thereto. For example, the present invention can be applied to a large scale integrated circuit designed from the first process stage for specific application.

The present invention can package the memory having a high packaging density and high versatility into the gate array, can fully utilize the performance of the memory and can accomplish the gate array with the built-in memory circuit portion which does not exert any adverse influences on the basic gate circuit portion in connection with wirings.

What is claimed is:

1. A semiconductor device formed on a semiconductor substrate, comprising:
    a memory having a plurality of memory cells, formed at a predetermined portion of said substrate;
    a basic cell region formed at another predetermined portion of said semiconductor substrate adjacent to a predetermined side of said memory;
    a first input/output port having a plurality of terminals, located at said predetermined side of said memory to permit coupling of said memory to said basic cell region and to a predetermined element other than said basic cell region; and
    a second input/output port having a plurality of terminals, located on another side of said memory to permit coupling of said memory to said basic cell region and said predetermined element other than said basic cell region,
    wherein both said first and second input/output ports are accessible to all of said plurality of memory cells, and wherein each data input/output operation from said memory cells of said memory to said basic cell region or said predetermined element is made using either said first or second ports based upon a determination of which of said first and second ports is nearer to said basic cell region or said predetermined element which is used for the data input/output operation.

2. A semiconductor device according to claim 1, wherein said data input/output operation from said memory cells of said memory to said basic cell region is made using said first port which is nearer to said basic cell region than said second port.

3. A semiconductor device according to claim 1, wherein said data input/output operation from said memory cells of said memory to said predetermined element is made using said second port which is nearer to said predetermined element than said first port.

4. A semiconductor device according to claim 1, wherein said predetermined element comprises an input/output buffer.

5. A semiconductor device according to claim 1, wherein said another side of said memory is adjacent to said predetermined side of said memory.

6. A semiconductor device according to claim 1, wherein said another side of said memory is adjacent to said predetermined side of said memory.

7. A semiconductor device formed on a semiconductor substrate, comprising:
- a memory having a number of cells, formed at a predetermined portion of said substrate;
- a basic cell region formed at another predetermined portion of said semiconductor substrate adjacent to a predetermined side of said memory;
- a first input/output port having a plurality of terminals, located at said predetermined side of said memory to couple said memory to said basic cell region; and
- a second input/output port having a plurality of terminals, located on another side of said memory to couple said memory to a predetermined element other than said basic cell region, wherein both said first and second input/output ports are accessible to all of said plurality of said memory cells, wherein each data input/output operation from said memory cells of said memory to said basic cell region is made using said first input/output port, wherein each data input/output operation from said memory cells of said memory to said predetermined element is made using said second input/output port, wherein said basic cell region is closer to said first input/output port than to said second input/output port, and wherein said predetermined element is closer to said second input/output port than to said first input/output port.

* * * * *